United States Patent [19]
Klughart

[11] Patent Number: 5,801,411
[45] Date of Patent: Sep. 1, 1998

[54] INTEGRATED CAPACITOR WITH REDUCED VOLTAGE/TEMPERATURE DRIFT

[75] Inventor: Kevin Mark Klughart, Addison, Tex.

[73] Assignee: Dallas Semiconductor Corp., Dallas, Tex.

[21] Appl. No.: 585,059

[22] Filed: Jan. 11, 1996

[51] Int. Cl.[6] .................................................. H03K 19/12
[52] U.S. Cl. .......................... 257/296; 257/213; 257/300; 307/482; 307/443
[58] Field of Search .......................... 257/213, 296, 257/300, 308, 216; 307/482, 443, 465, 553; 331/116 FE

[56] References Cited

U.S. PATENT DOCUMENTS

| | | | |
|---|---|---|---|
| 5,008,799 | 4/1991 | Montalvo | 257/296 |
| 5,073,731 | 12/1991 | Oh | 307/482 |
| 5,550,397 | 8/1996 | Lifshitz et al. | |
| 5,650,340 | 7/1997 | Burr et al. | |
| 5,674,760 | 10/1997 | Hong | |

OTHER PUBLICATIONS

Gregorian, Roubik and Temes, Gabor C., *Analog MOS Integrated Circuits for Signal Processing*, Section 3.5. MOS Capacitors, pp. 86–93.

Primary Examiner—Carl W. Whitehead, Jr.
Attorney, Agent, or Firm—Jenkens & Gilchrist

[57] ABSTRACT

An integrated capacitor structure having substantially reduced temperature and voltage coefficients including a combination of conventional N-depletion and P-depletion MOS gate capacitors connected in parallel and optimized for use at low bias voltages, where both the N-depletion and P-depletion capacitor structures have substantially zero temperature coefficients in their fully depleted region of operation.

28 Claims, 21 Drawing Sheets

Reverse Bipolar Capacitance
Rank 1 Eqn 2153 $z=a+by+cy^2+EXPX(d,e)$
$r^2=0.96224228$ DF Adj $r^2=0.9199223$ FitStdErr=8.311495e-14 Fstat=4816.5989
a=1.684434e-12 b=-3.785966e-13 c=2.6706377e-14
d=3.3951e-12 e=2319.2583

$$C_{ND}(V_{bias}) = \frac{A_{Ng}}{A_{Ns}} \left[ C_{N0} + \frac{C_{N1}}{\pi} \left[ \tan^{-1}\left(\frac{V_{bias} - C_{N2}}{C_{N3}}\right) + \frac{\pi}{2} \right] \right]$$

$0V \leq V_{bias} \leq +10V$    bias voltage $-55°C \leq T_A \leq +125°C$    ambient temperature $C_{N0} = 24.117572 \times 10^{-12}$ $C_{N1} = 4.0334054 \times 10^{-12}$ $C_{N2} = -447.64205 \times 10^{-3}$ $C_{N3} = -416.8038 \times 10^{-3}$ $A_{Ng} \equiv$ capacitor gate area in square microns $A_{Ns} = 80 \times 425 \times 1$ (test structure scaling factor)

$$C_{PD}(V_{bias}) = \frac{A_{Pg}}{A_{Ps}} \left[ C_{P0} + C_{P1}V_{bias} + C_{P2}\left(\sqrt{V_{bias}^3}\right) \right]^{-1}$$

$0V \leq V_{bias} \leq +10V$  bias voltage
$-55°C \leq T_A \leq +125°C$  ambient temperature
$C_{P0} = 20.804906 \times 10^{+9}$
$C_{P1} = 5.568295 \times 10^{+9}$
$C_{P2} = 8.6114252 \times 10^{-3}$
$A_{Pg} \equiv$ capacitor gate area in square microns
$A_{Ps} = 80 \times 425 \times 1$ (test structure scaling factor)

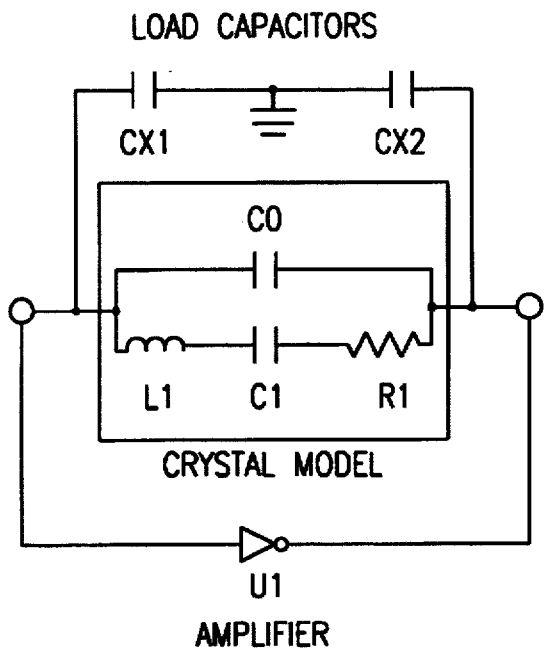

FIG. 19

$$\omega = \frac{\sqrt{\left(+\sqrt{C_1}\sqrt{C_x^2 C_1 R_1^4 - (2C_x C_1 + 4C_x^2)L_1 R_1^2 + C_1 L_1^2}\right)}}{\sqrt{2C_x C_1 L_1}}$$

$$C_x = \frac{C_{x1} C_{x2}}{C_{x1} + C_{x2}} + C_0$$

$\omega$ = operating frequency in radians/sec
$C_{x1}$ ≡ load capacitor 1
$C_{x2}$ ≡ load capacitor 2
$C_x$ ≡ effective load capacitance
$C_0$ ≡ crystal model parallel (shunt) capacitance
$C_1$ = crystal model series (motional) capacitance
$L_1$ = crystal model series (motional) inductance
$R_1$ = crystal model series resistance

FIG. 20

$C_r \equiv$ required total capacitance value
$A_{Ng} \equiv$ required N-depletion capacitor area for zero voltage coefficient $$\frac{nA_{Ns}\begin{pmatrix} \sqrt{V_{bias}}(6C_{P2}C_T V_{bias}^2 - 12C_{N2}C_{P2}C_T V_{bias} + 6(C_{N3}^2 + C_{N2}^2)C_{P2}C_T) \\ + 4C_{P1}C_T V_{bias}^2 - 8C_{N2}C_{P1}C_T V_{bias} + 4(C_{N3}^2 + C_{N2}^2)C_{P1}C_T \end{pmatrix}}{\begin{bmatrix} \sqrt{V_{bias}} \begin{bmatrix} \begin{pmatrix} 6C_{N1}C_{P2}V_{bias}^2 \\ -12C_{N1}C_{N2}C_{P2}V_{bias} \\ +6C_{N1}(C_{N3}^2 + C_{N2}^2)C_{P2} \end{pmatrix} \arctan\left(\frac{V_{bias} - C_{N2}}{C_{N3}}\right) \\ + 3\pi(C_{N1} + 2C_{N0})C_{P2}V_{bias}^2 \\ +(4C_{N1}C_{N3} - 6\pi(C_{N1} + 2C_{N0})C_{N2})C_{P2}V_{bias} \\ + 3\pi((C_{N1} + 2C_{N0})C_{N3}^2 + (C_{N1} + 2C_{N0})C_{N2}^2)C_{P2} \end{bmatrix} \\ (4C_{N1}C_{P1}V_{bias}^2 - 8C_{N1}C_{N2}C_{P1}V_{bias} + 4C_{N1}(C_{N3}^2 + 2C_{N2})C_{P1})\arctan\left(\frac{V_{bias} - C_{N2}}{C_{N3}}\right) \\ + 2\pi(C_{N1} + 2C_{N0})C_{P1}V_{bias}^2 \\ +(4C_{N1}C_{N3} - 4\pi(C_{N1} + 2C_{N0})C_{N2})C_{P1}V_{bias} \\ + 2\pi((C_{N1} + 2C_{N0})C_{N3}^2 + (C_{N1} + 2C_{N0})C_{N2}^2)C_{P1} \\ + 4C_{N1}C_{N3}C_{P0} \end{bmatrix}}$$

FIG. 22

$C_T \equiv$ required total capacitance value
$A_{Pg} \equiv$ required P-depletion capacitor area for zero voltage coefficient $$\frac{A_{Pg}\begin{pmatrix} 4C_{N1}C_{N3}C_{P2}^2 C_T V_{bias}^3 + 4C_{N1}C_{N3}C_{P1}^2 C_T V_{bias}^2 \\ + 8\sqrt{V_{bias}}(C_{N1}C_{N3}C_{P1}C_{P2}C_T V_{bias}^2 + C_{N1}C_{N3}C_{P0}C_{P2}C_T V_{bias}) \\ + 8C_{N1}C_{N3}C_{P0}C_{P1}C_T V_{bias} + 4C_{N1}C_{N3}C_{P0}^2 C_r C_T \end{pmatrix}}{\begin{bmatrix} \sqrt{V_{bias}} \begin{bmatrix} \begin{pmatrix} 6C_{N1}C_{P2}V_{bias}^2 \\ -12C_{N1}C_{N2}C_{P2}V_{bias} \\ +6C_{N1}(C_{N3}^2 + C_{N2}^2)C_{P2} \end{pmatrix} \arctan\left(\frac{V_{bias} - C_{N2}}{C_{N3}}\right) \\ + 3\pi(C_{N1} + 2C_{N0})C_{P2}V_{bias}^2 \\ +(4C_{N1}C_{N3} - 6\pi(C_{N1} + 2C_{N0})C_{N2})C_{P2}V_{bias} \\ + 3\pi((C_{N1} + 2C_{N0})C_{N3}^2 + (C_{N1} + 2C_{N0})C_{N2}^2)C_{P2} \end{bmatrix} \\ (4C_{N1}C_{P1}V_{bias}^2 - 8C_{N1}C_{N2}C_{P1}V_{bias} + 4C_{N1}(C_{N3}^2 + C_{N2}^2)C_{P1})\arctan\left(\frac{V_{bias} - C_{N2}}{C_{N3}}\right) \\ + 2\pi(C_{N1} + 2C_{N0})C_{P1}V_{bias}^2 \\ +(4C_{N1}C_{N3} - 4\pi(C_{N1} + 2C_{N0})C_{N2})C_{P1}V_{bias} \\ + 2\pi((C_{N1} + 2C_{N0})C_{N3}^2 + (C_{N1} + 2C_{N0})C_{N2}^2)C_{P1} \\ + 4C_{N1}C_{N3}C_{P0} \end{bmatrix}}$$

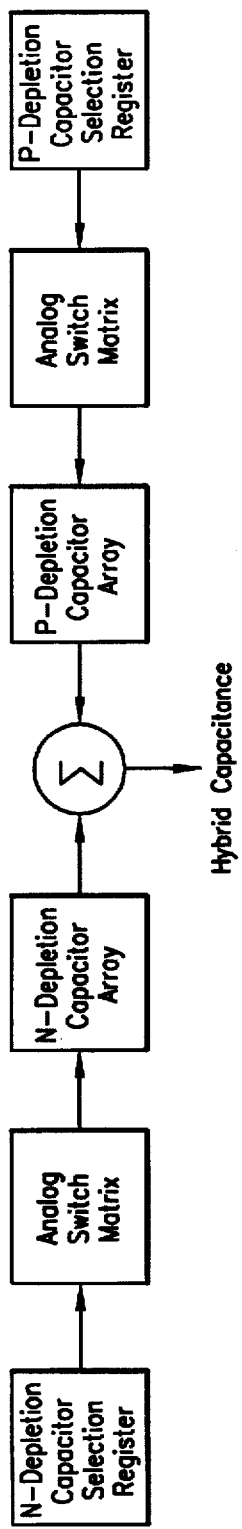
FIG. 23
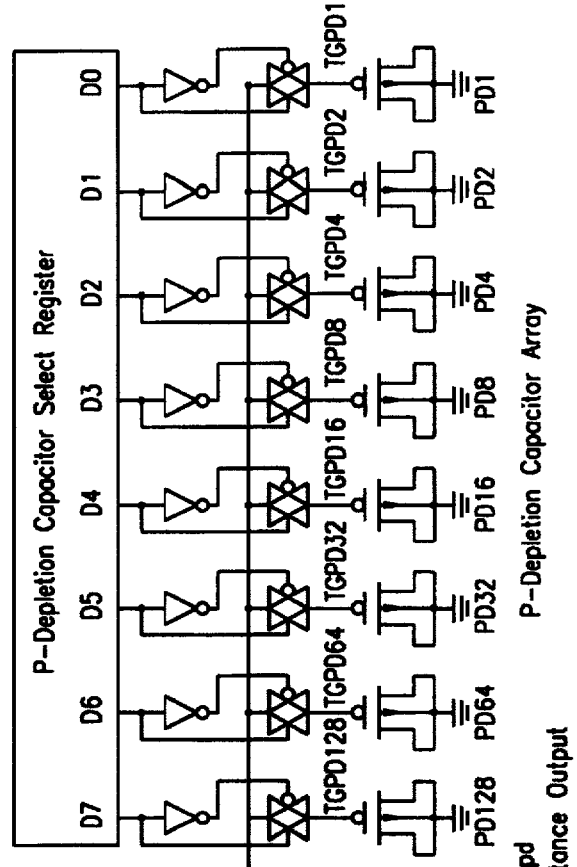
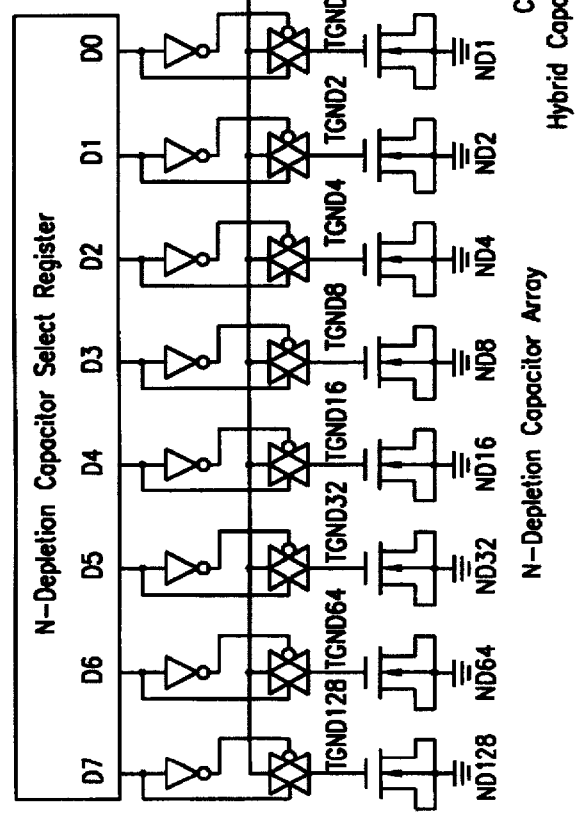
FIG. 24

INTEGRATED CAPACITOR WITH REDUCED VOLTAGE/TEMPERATURE DRIFT

FIELD OF THE INVENTION

The present invention relates to capacitors and, in particular, to monolithic integrated capacitors with reduced or modulated voltage and temperature drift.

BACKGROUND OF THE INVENTION

The current state of the art in monolithic integrated capacitors does not permit the practical fabrication of capacitor structures with simultaneous zero temperature coefficient and zero voltage coefficient using standard enhancement or depletion MOSFET devices.

To achieve zero voltage and temperature coefficients, integrated circuit designers have traditionally been forced to use sandwiched parallel plates of polysilicon, metal, or combinations of these techniques. Structures developed by these techniques, while providing substantial voltage and temperature stability, suffer from a very low capacitance/area ratio, making them impractical for situations requiring large on-chip capacitance values.

In addition, these sandwiched polysilicon/metal techniques generally require additional integrated circuit fabrication steps which are very expensive to implement. Additionally, the overall reliability decreases and the fabrication yield decreases with the addition of each new fabrication step.

Current technologies using alternative capacitor structures which have high capacitance/area ratios such as reversed-biased bipolar junctions suffer from severe voltage and temperature coefficients. This makes bipolar capacitor structures impractical candidates for use in circuits such as crystal oscillators and other circuits requiring capacitance values to be tightly controlled so as to maintain the stability of an oscillator or other circuit subsystem.

It has been demonstrated for some time that MOS enhancement and depletion transistors can be used as capacitors by using the polysilicon gate as one plate of the capacitor and the bulk/source/drain connections of the same transistor as the other capacitor plate.

Depending on the process technology, it can be expected to achieve a capacitance/area ratio on the order of 1–10 fF per square micron using this technology. The predominant control mechanisms for the total capacitance using this technique are the total gate area of the MOS device and the oxide thickness of the MOS device. Both of these can be adjusted to achieve practical capacitor values on the order of several picofarads to several hundred picofarads with conventional process technologies.

The major issue faced by integrated circuit designers when using this enhancement or depletion MOS capacitor structure is that the resulting structure has a significant voltage coefficient. That is to say, the resulting capacitance of the MOS transistor varies with the bias voltage applied to the gate terminal of the capacitor. This modulation of capacitance is directly related to the doping levels of the MOS channel, the applied gate bias, and to a small degree ambient temperature. Variations due to applied gate bias can be on the order of 50% or more depending on the threshold of the MOS device, which in turn defines the relative degree of enhancement or depletion occurring within the MOS drain-source channel.

Currently, integrated circuit designers are aware of this behavior of both N-channel (NCH) and P-channel (PCH) MOS devices in both the enhancement and depletion modes. In many circumstances the loss of effective capacitance can be planned when the target circuit in which the capacitor is used is designed.

In addition, higher gate potentials can be utilized to force the MOS device into its predominant enhancement or depletion mode of operation, thus ensuring the maximum effective capacitance that the device can generate.

However, in many circumstances these techniques are not satisfactory because it may be impossible to tolerate much modulation in effective capacitance in the target circuit.

Additionally, since many circuits are now being powered by low voltage sources such as batteries, the maximum voltage available for use with the capacitor may be severely limited. The maximum voltage coefficient for MOS capacitor structures occurs around 0 V applied bias voltage, making circuit operation at low voltages equivalent to the maximum operating voltage coefficient for the MOS capacitor structures.

As previously mentioned, in order to achieve improved voltage coefficients within integrated monolithic capacitors, some current technologies use sandwiched plates of metal or polysilicon (poly) which when properly spaced and configured can yield a capacitance substantially void of both temperature and voltage coefficients.

The major drawback from using such an approach is that of area efficiency. For a typical process, the metal-to-metal capacitance is on the order of 0.04 fF per square micron and the poly-to-poly capacitance is on the order of 0.02 fF per square micron.

A conventional enhancement or depletion MOS capacitor structure has a gate-bulk capacitance on the order of 2.0 fF per square micron, assuming a typical gate oxide thickness of 175 Angstroms. This represents an area efficiency increase on the order of 10–100 times that of the metal—metal or poly—poly capacitor structures. That is, a MOS enhancement or depletion capacitor will be 10–100 times smaller than the equivalent metal—metal or poly—poly capacitor structure. This decrease in efficiency can have a profound impact on the overall size of an integrated circuit and for that reason it is generally impractical to integrate large value capacitors using the metal—metal or poly—poly technique.

An additional reason for using caution when applying the metal—metal or poly—poly capacitor technique is that in many cases integrated circuit process technologies do not support double level metal or double level polysilicon as a default process flow. The additional metal layers or additional polysilicon layers increase processing costs while at the same time decreasing overall process yields. Both of these facts discourage the use of the metal—metal or poly—poly technique.

As an alternative to MOS capacitor structures, some designers have opted for the use of bipolar junction capacitors. These devices have significant voltage and temperature coefficients which make them unsuitable for most precision integrated capacitor applications.

Within the context of integrated monolithic capacitors, it is a desirable feature that such capacitors have a fixed capacitance value over applied bias voltage, temperature, and operating frequency.

In many situations the target frequency of an integrated circuit design is fixed and well known, such as in the case of a crystal oscillator. FIG. 19 illustrates a conventional crystal oscillator having an inverting amplifier, crystal resonator and external load capacitors.

In this context, conventional crystal oscillators utilizing an inverting amplifier and a parallel-resonant crystal are required to have two load capacitors connected such that one plate from each capacitor is connected to each of the crystal terminals and the remaining capacitor plate is connected to the circuit node ground, which serves as a floating AC node for the purposes of circuit analysis.

As technology has improved and miniaturization has taken place, the capacitor functionality has been migrated from using external discrete capacitors connected to the crystal to integrated monolithic capacitors which are fabricated on the same silicon substrate as the inverting oscillator amplifier.

A primary purpose of the load capacitors used in this configuration is to "trim" the crystal frequency to a known and predictable value. Conventional crystals require a load capacitance on the order of 3–50 pF, depending on the crystal type and desired operating mode.

The addition of the load capacitors results in a lowering of the parallel anti-resonant frequency when using an inverting oscillator amplifier configuration. To first order the oscillator amplifier frequency ($\omega$) after the load capacitors have been added is given by the formula in FIG. 20. As can be seen from this equation the load capacitance adds to the shunt capacitance of the crystal and as such has a direct impact on the operating frequency of the crystal oscillator. Thus, variations in the absolute load capacitance value have a direct impact on the operating frequency of the crystal oscillator system.

It is often highly desirable that the load capacitance be substantially ideal in that it does not drift due to excitation voltage, bias voltage, or temperature.

Drifts in load capacitance value due to temperature will tend to cause the oscillation frequency to drift as the temperature changes. Drifts in load capacitance value due to bias voltage will tend to both shift the oscillation frequency as the bias point of the oscillator changes, but also cause a shift in spectral purity of the crystal oscillator.

This effect is caused by the fact that as the crystal oscillator sinusoidal waveform transitions from a maximum voltage value to a minimum voltage value, the effective capacitance seen by the crystal will be dynamically changing due to the voltage coefficient associated with the load capacitance. This voltage coefficient causes the spectral width of the crystal oscillator to shift due to modulations in the feedback phase versus the phase shift required by the inverting oscillator amplifier to achieve 0 degrees phase shift in a closed loop configuration and thus sustain oscillation. Thus, there exists a complex relationship between the load capacitance voltage coefficient, the operating point of the oscillator amplifier, the mean frequency of the oscillator system, and the spectral purity (spectral width) of the oscillator waveform.

Since conventional crystal oscillators require a substantial amount of load capacitance (on the order of 12 pF–24 pF for a standard 32768 Hz watch crystal), standard MOS N-depletion capacitor structures have been used to date to generate the required load capacitance. To use other techniques such as sandwiched metal—metal or poly—poly capacitors would require a significant increase in the silicon area required to implement the crystal oscillator system.

However, as mentioned previously, the voltage coefficient drift associated with these structures is significant, especially below 3 V applied bias voltage. The large voltage coefficient at low voltages is a very significant issue in this application as the standard 32768 Hz watch crystal oscillator operates using a 3 V lithium battery as the power source.

Another problem is that the bias point of the inverting oscillator amplifier used in these configurations is on the order of 0.75–1.0 V.

Conventional MOS N-depletion capacitor structures exhibit a voltage coefficient on the order of 1.5 to 4.0%/V (15000 to 40000 ppm/V) within this region of bias operation. This voltage coefficient represents a huge potential mechanism for frequency drift within the crystal oscillator system. As the bias point changes within the inverting oscillator amplifier, or as the supply voltage changes, there will be significant drift in the oscillating frequency due simply to changes in the effective load capacitance presented to the crystal.

It should be noted that although there are significant temperature coefficients associated with most crystal resonators, most N-depletion and P-depletion capacitor structures have negligible temperature coefficients. Additionally, it should be observed that the load capacitor structure used by the crystal oscillator system need not support a zero temperature and voltage coefficient over a wide range of bias and excitation voltages.

Support for reduced temperature and voltage coefficients over a 0.5–1.0 V bias operating range would be sufficient for the targeted application when used with conventional 32768 Hz watch crystal oscillators. The same constraint is true for operating frequency, as the only frequency of interest in this targeted application is 32768 Hz.

Since enhancement and depletion capacitors have some frequency coefficient, it is significant to note that this frequency coefficient is negligible at low frequencies such as the 32768 Hz target frequency in this application.

OBJECTS AND SUMMARY OF THE INVENTION

The present invention overcomes the above identified problems by providing a general, practical, and predetermined capacitance structure which has substantially zero capacitance drift due to fluctuations in temperature and applied bias voltage.

Accordingly, it is an object of the present invention to provide a hybrid capacitor having essentially zero voltage and temperature coefficients within a predetermined range of applied bias voltages.

It is a further object of the present invention to provide a hybrid capacitor having substantially reduced voltage coefficient at low applied bias voltages.

It is yet another object of the present invention to provide a hybrid capacitor having substantially reduced voltage and temperature coefficients where no additional mask steps from standard process flows is required It is another object of the present invention to provide a hybrid capacitor having substantially reduced voltage and temperature coefficients with an area 10 to 100 times smaller than conventional poly—poly or metal—metal capacitor structures.

In accordance with the above and other objects there is provided an integrated monolithic capacitor having N-channel and P-channel MOSFET capacitors with each of the MOSFET capacitors being doped and configured in a manner to achieve substantially reduced voltage and temperature coefficients at predetermined bias voltages.

BRIEF DESCRIPTION OF THE DRAWINGS

For a more complete understanding of the present invention and the objects and advantages thereof, reference may be made to the following descriptions taken in conjunction with the accompanying drawings in which:

FIG. 5 is a graph illustrating the simulated capacitance versus bias voltage and ambient temperature for the N-depletion capacitor structure of FIG. 3a;

FIG. 6 is a graph illustrating the measured capacitance versus bias voltage and ambient temperature for the N-depletion capacitor structure of FIG. 3a;

FIG. 7 is a graph illustrating the modeled capacitance versus bias voltage for the N-depletion capacitor structure of FIG. 3a;

FIG. 8 is the model equation of the graph illustrated in FIG. 7;

FIG. 11 is a graph illustrating the simulated capacitance versus bias voltage and ambient temperature for the P-depletion capacitor structure of FIG. 9a;

FIG. 12 is a graph illustrating the measured capacitance versus bias voltage and ambient temperature for the P-depletion capacitor structure of FIG. 9a;

FIG. 13 is a graph illustrating the modeled capacitance versus bias voltage for the P-depletion capacitor structure of FIG. 9a;

FIG. 14 is the model equation for the graph illustrated in FIG. 13;

FIG. 19 is a schematic diagram illustrating a conventional crystal oscillator;

FIG. 20 is a formula giving the approximate relationship between the resonant frequency and the crystal illustrated in FIG. 19;

FIG. 22 illustrates the optimized equations needed to calculate the required N-depletion and P-depletion capacitor sizes given a target capacitance and desired operating bias point of the present invention;

FIG. 23 is a block diagram illustrating another embodiment of the present invention;

FIG. 24 is a schematic diagram of another preferred embodiment of the present invention;

DESCRIPTION OF THE PRESENTLY PREFERRED EXEMPLARY EMBODIMENTS

Figure 2:
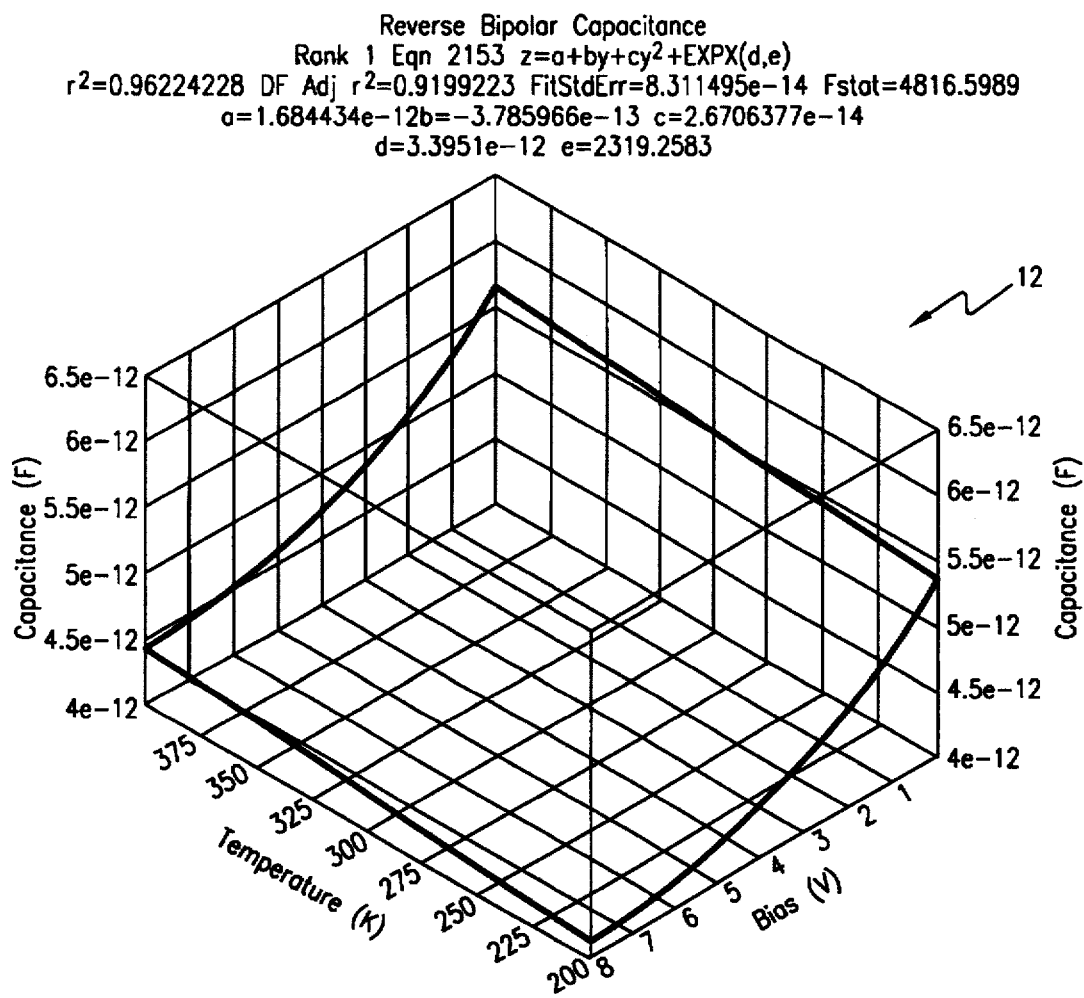
FIG. 2 is a graph illustrating the measured capacitance of the capacitor of FIG. 1.
Figure 1:
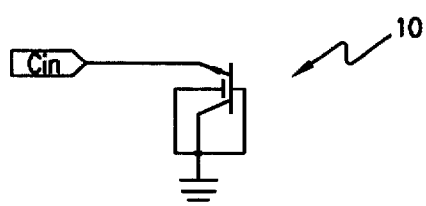
FIG. 1 is a schematic illustrating a conventional reversed-biased bipolar capacitor structure.

Referring now to FIGS. 1 and 2, FIG. 1 is a schematic diagram illustrating a conventional reversed-biased bipolar capacitor 10, with FIG. 2 representing a graph 12 of the measured capacitance of capacitor 10. Graph 12 shows the substantial variation in capacitance over both applied voltage and ambient temperature. This voltage and temperature dependence makes this type of capacitor structure unsuitable for use in precision frequency sources such as crystal oscillators.

Figure 4:
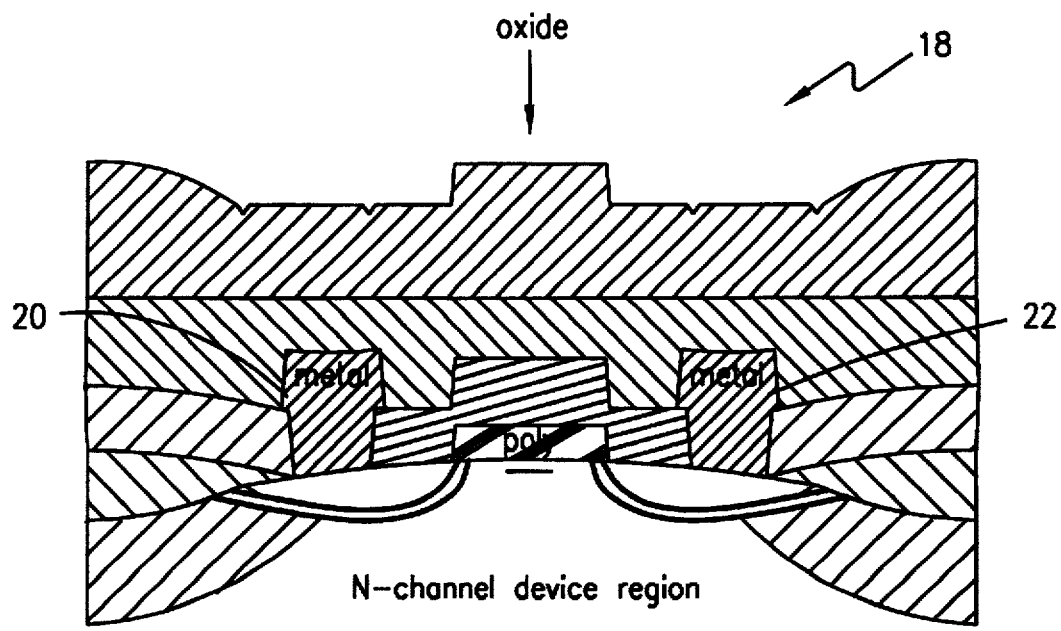
FIG. 4 is sectional view of the structure of a N-depletion capacitor.
Figure 3A:
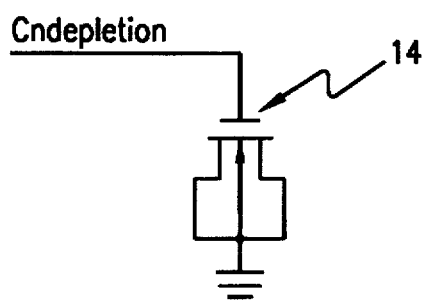
FIGS. 3a–3b are schematics illustrating MOSFET capacitors with FIG. 3a illustrating an N-depletion capacitor and FIG. 3b illustrating an N-enhancement capacitor.
Figure 3B:
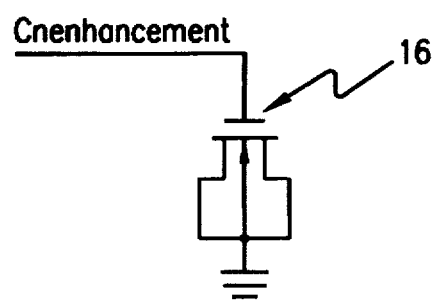

Referring now to FIGS. 3a–3b and 4, FIG. 3a is a schematic diagram of a common N-depletion capacitor 14, FIG. 3b is a schematic diagram of a common N-enhancement capacitor 16, and FIG. 4 is a sectional view of a capacitor 18, representing the physical structure of common N-depletion capacitor such as shown in FIG. 3a.

In a practical implementation the drain/source metalization 20 and 22 are electrically connected to the substrate. For most common implementations capacitor 18 will be implemented on a P-type silicon substrate, but it is also possible to implement this structure in a P-well on an N-type silicon substrate. In this P-well implementation it would be possible to generate a capacitance with respect to the most positive node in the system comprising the silicon substrate, typically denoted as Vcc or Vdd.

Capacitor 18 illustrated in FIG. 4 would be identical to that of a standard N-channel enhancement MOSFET with the addition of one depletion implant processing step (typically implemented with a phosphorus ion implant) Therefore, it is contemplated to be within the scope of this invention that both the N-depletion and N-enhancement capacitors illustrated in FIGS. 3a and 3b, respectively, can be utilized as equivalents to implement the capacitance characteristics required by the present invention.

Slight changes to either the implant doses or the ratio of N-type to P-type capacitor would be required in the case of this substitution, but the general principle allowing the generation of a hybrid capacitor structure with substantially reduced voltage coefficient would still hold true.

Figure 5:
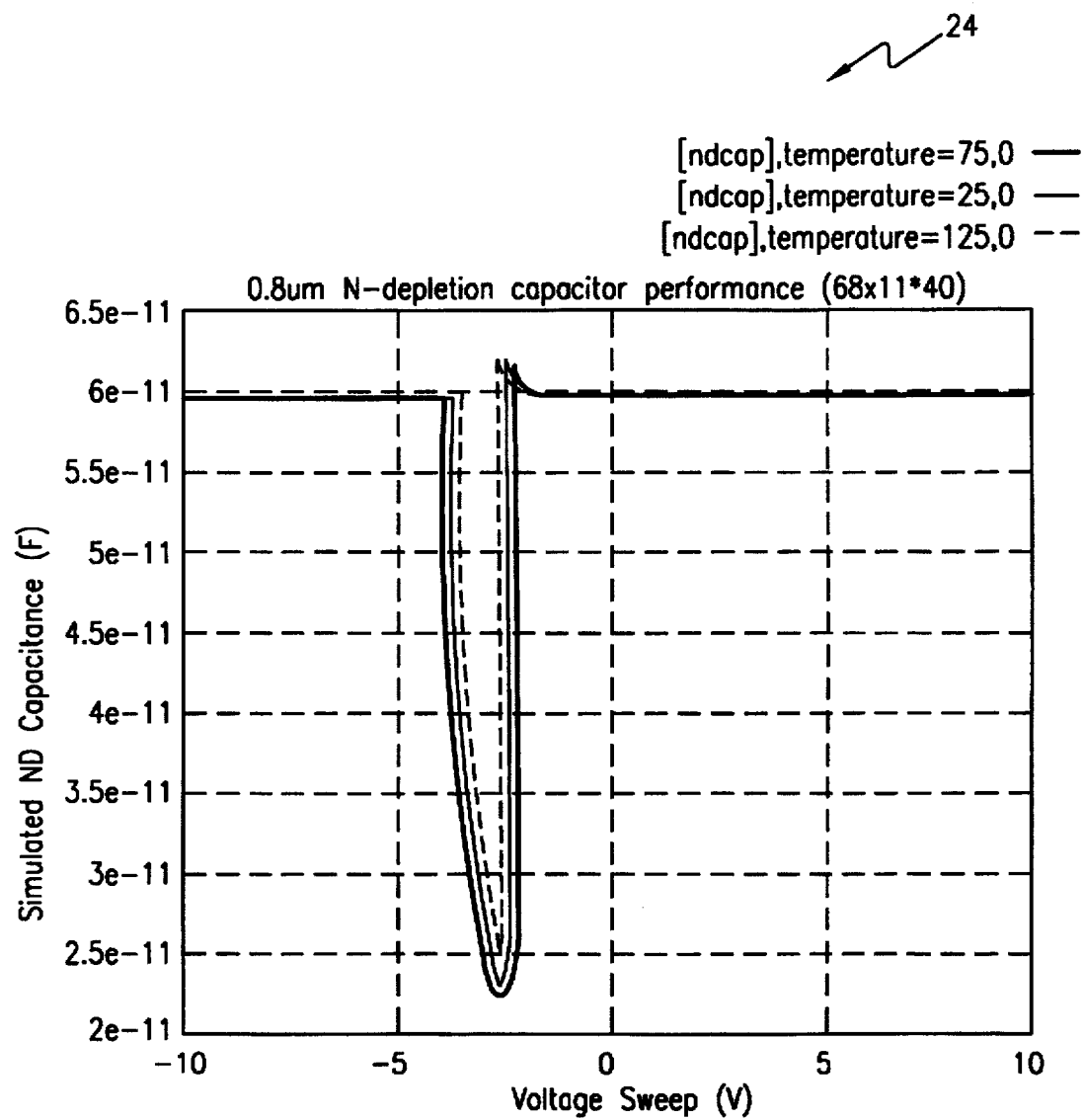

Referring now to FIG. 5, graph 24 illustrates the simulated capacitance versus bias voltage of the N-depletion capacitor 14 of FIG. 3a. Graph 24 clearly illustrates that conventional simulations indicate no modulation of capacitance for positive bias voltages. Therefore, conventional device and circuit simulators can not be utilized to either understand or correct the non-ideal capacitance characteristic of N-depletion capacitors.

Figure 6:
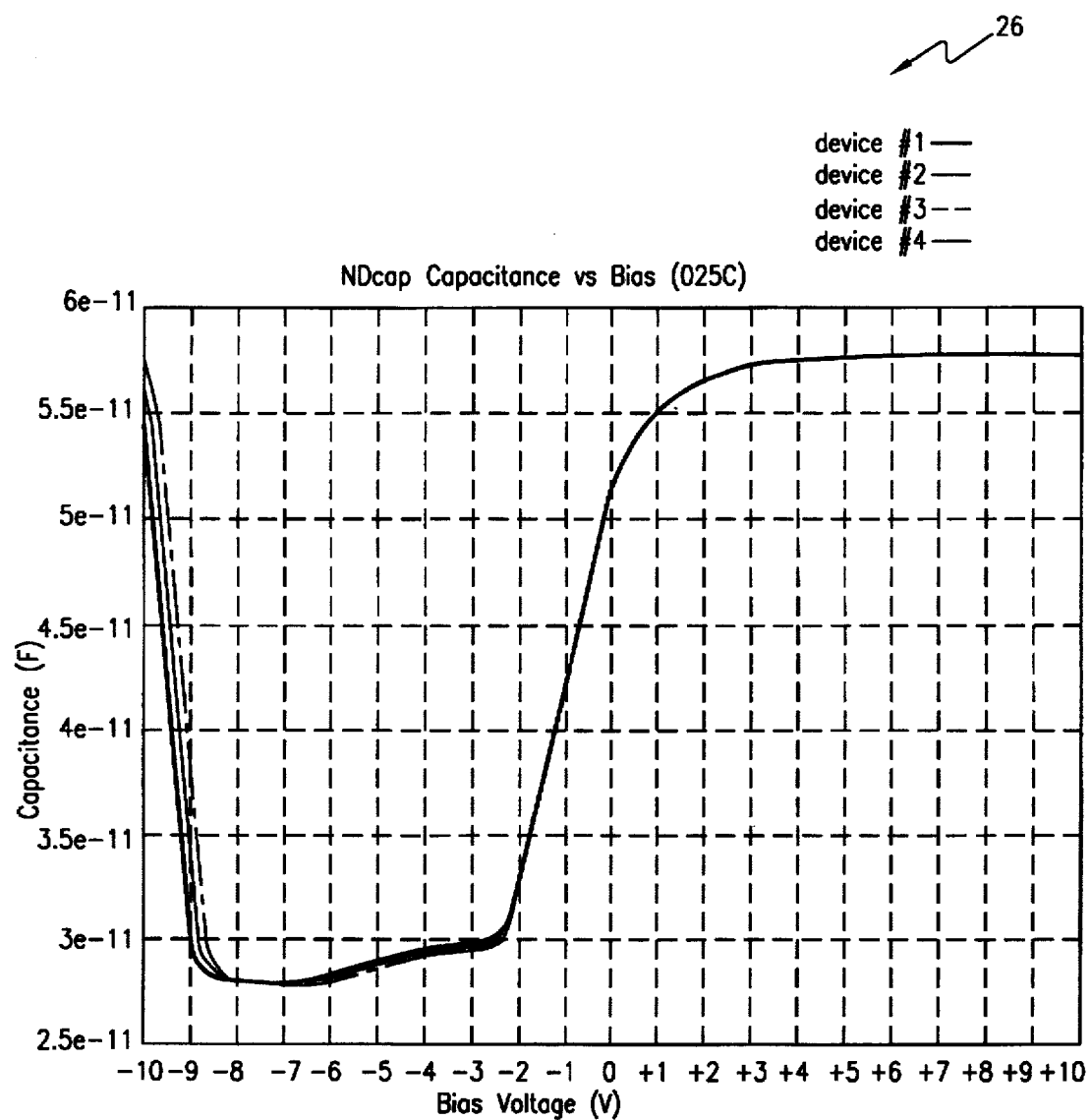

Referring now to FIG. 6, graph 26 illustrates the actual measured capacitance versus bias voltage and ambient temperature for N-depletion capacitor 14 illustrated in FIG. 3a. Graph 26 shows that the actual capacitance varies substantially from 0 V–2 V applied bias voltage.

Figures 7, 8:
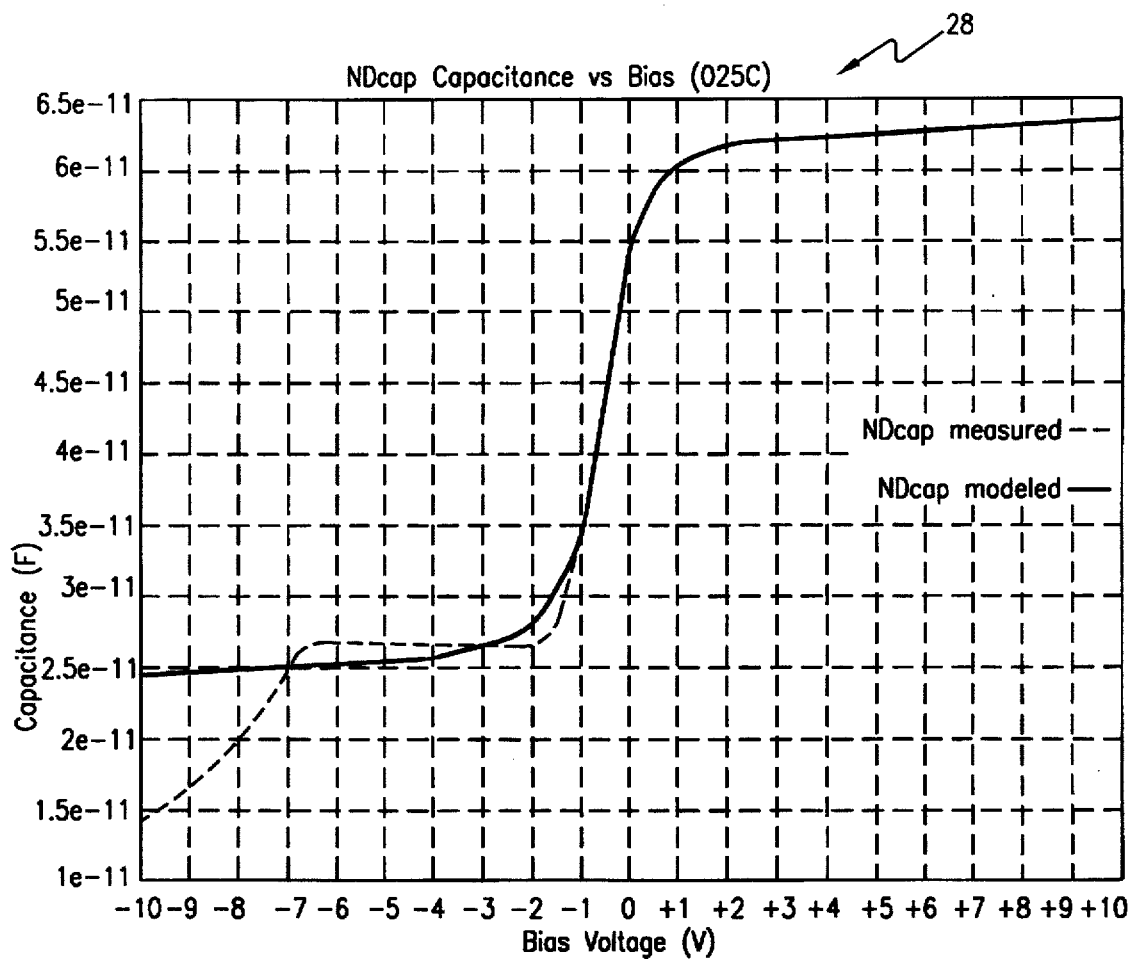

Referring now to FIGS. 7 and 8, FIG. 7 illustrates a graph 28 of the modeled capacitance versus bias voltage for N-depletion capacitor 14 shown in FIG. 3a, and FIG. 8 represents the model equation of graph 28.

The model equation of FIG. 8 provides an excellent fit for N-depletion capacitor 14 for bias voltages greater than 0 V. In order to maintain an accurate representation of the capacitor, this capacitance model was derived from measured data and not from conventional N-depletion MOS device equations.

Figure 10:
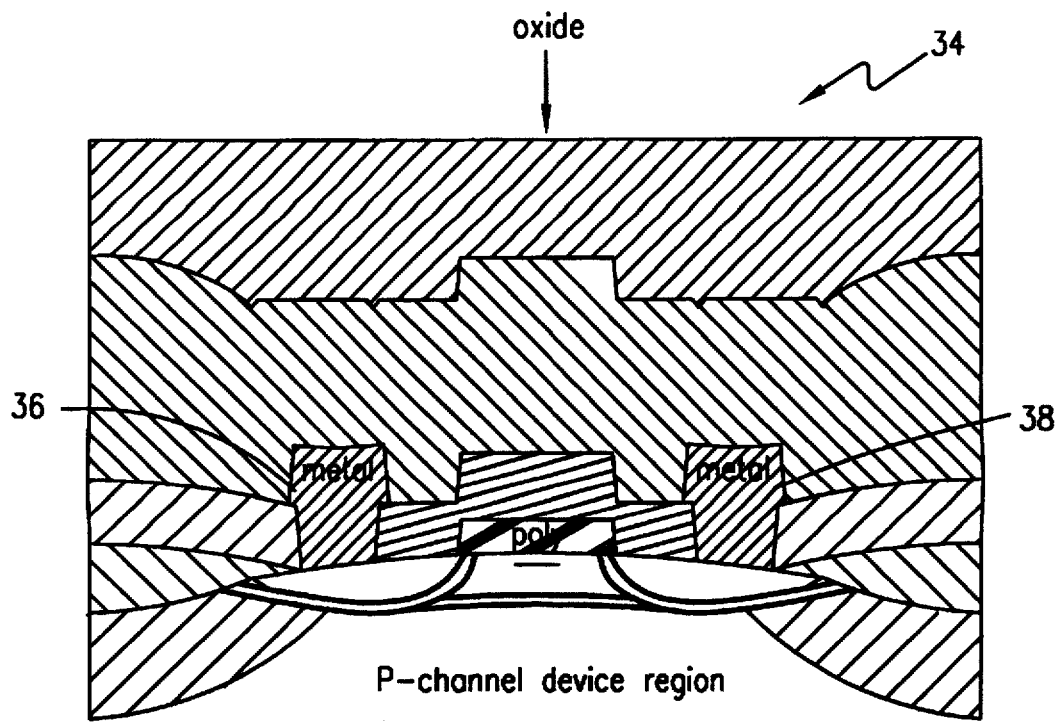
FIG. 10 is a sectional view of the structure of a P-depletion capacitor.
Figure 9A:
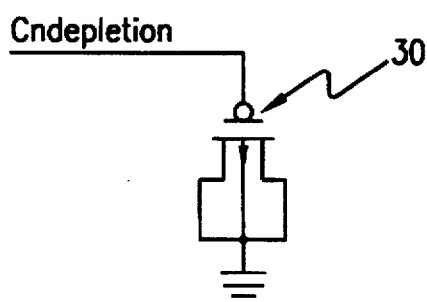
FIGS. 9a–9b are schematics illustrating MOSFET capacitors with FIG. 9a illustrating a common P-depletion capacitor and FIG. 9b illustrating a common P-enhancement capacitor.
Figure 9B:
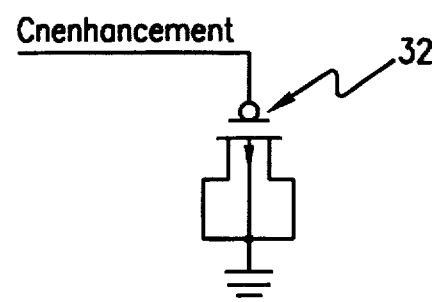

Referring now to FIGS. 9a–9b and 10, FIG. 9a is a schematic diagram of a common P-depletion capacitor 30, FIG. 9b is a schematic diagram of a common P-enhancement capacitor 32, and FIG. 10 is a sectional view of a capacitor 34, representing the physical structure of common P-depletion capacitor such as shown in FIG. 9a.

In a practical implementation the drain/source metalization 36 and 38 are electrically connected to the substrate. For most common implementations capacitor 34 will be implemented within an N-type well on P-type silicon substrate. Excellent results have been achieved when the nwell of P-depletion capacitor 30 is connected to the substrate. This is a very unconventional configuration and generally represents the direct opposite of P-depletion capacitors of current technologies.

It is also possible to implement this structure in a P-well on an N-type silicon substrate. Excellent results have been achieved when the pwell is connected to Vdd. In this P-well implementation it is possible to generate a capacitance with respect to the most positive node in the system comprising the silicon substrate, typically denoted as Vcc or Vdd.

Capacitor 34 illustrated in FIG. 10 would be identical to that of a standard P-channel enhancement MOSFET with the addition of one depletion implant processing step (typically implemented with a boron ion implant). Therefore, it is contemplated to be within the scope of this invention that both the P-depletion and P-enhancement capacitors 30 and 32 illustrated in FIGS. 9a and 9b, respectively, can be utilized as equivalents to implement the capacitance characteristics required by the present invention.

Slight changes to either the implant doses or the ratio of N-type to P-type capacitor would be required in the case of this substitution, but the general principle allowing the generation of a hybrid capacitor structure with substantially reduced voltage coefficient would still hold true.

Figure 11:
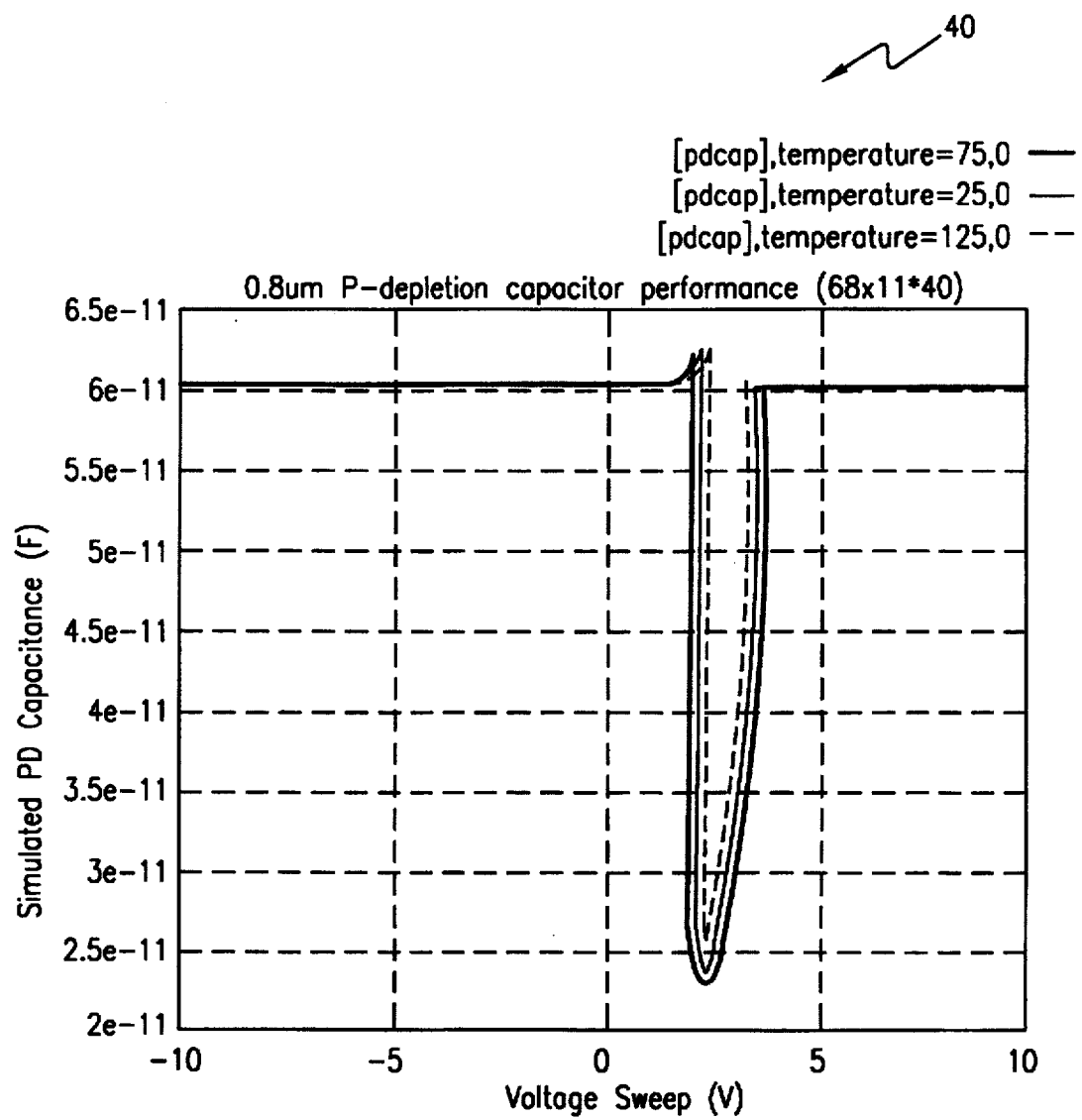

Referring now to FIG. 11, graph 40 illustrates the simulated capacitance versus bias voltage and ambient temperature of P-depletion capacitor 30 illustrated in FIG. 9a. Graph 40 shown that for conventional simulations there is no modulation of capacitance for small positive bias voltages. Therefore, conventional device and circuit simulators cannot be utilized to either understand or correct the non-ideal capacitance characteristic of P-depletion capacitors.

Figure 12:
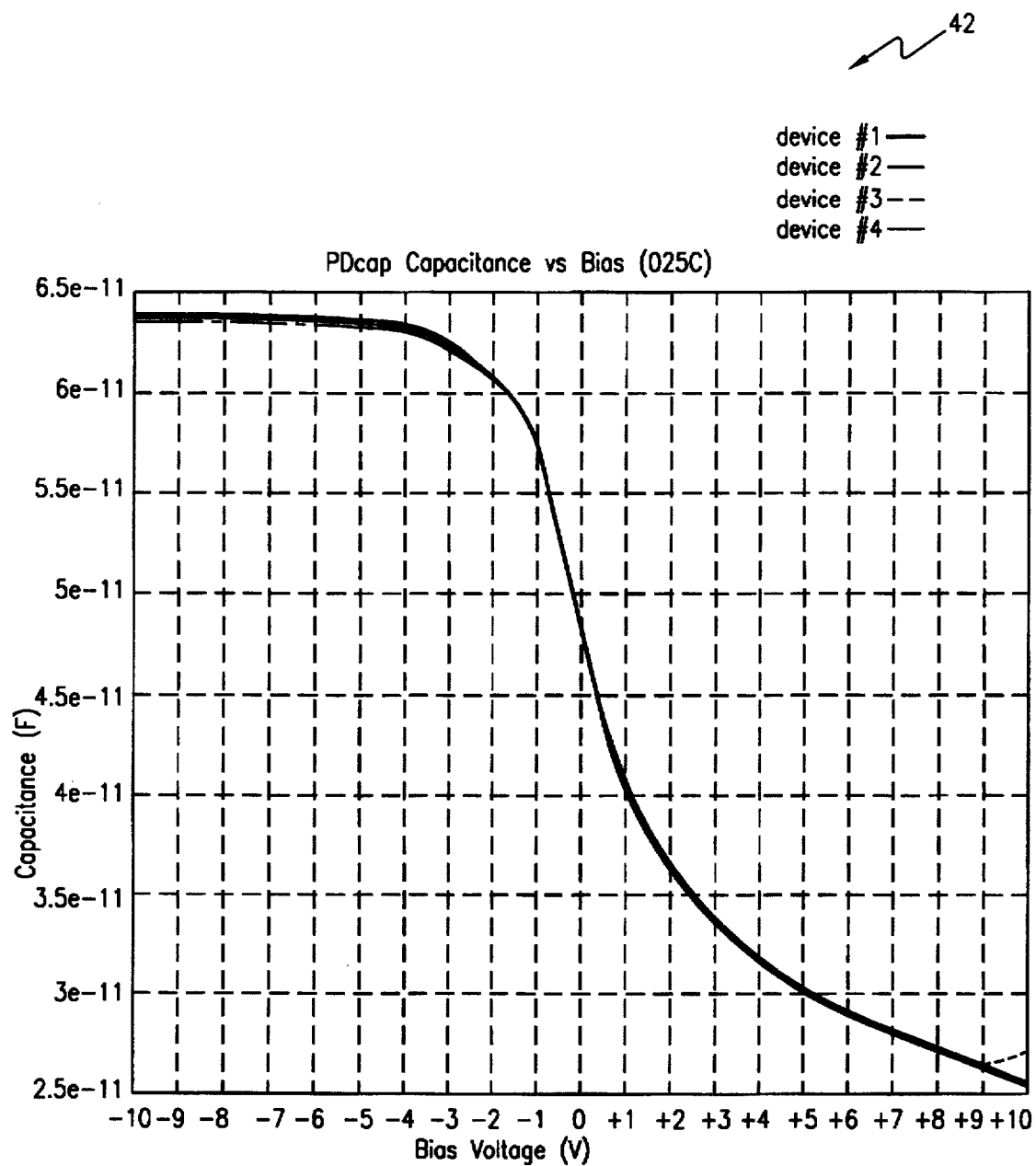

Referring now to FIG. 12, graph 42 is a graph of the measured capacitance versus bias voltage and ambient temperature for P-depletion capacitor 30 illustrated in FIG. 9a. Graph 42 illustrates that the actual capacitance varies substantially from 0 V–2 V applied bias voltage.

Figures 13, 14:
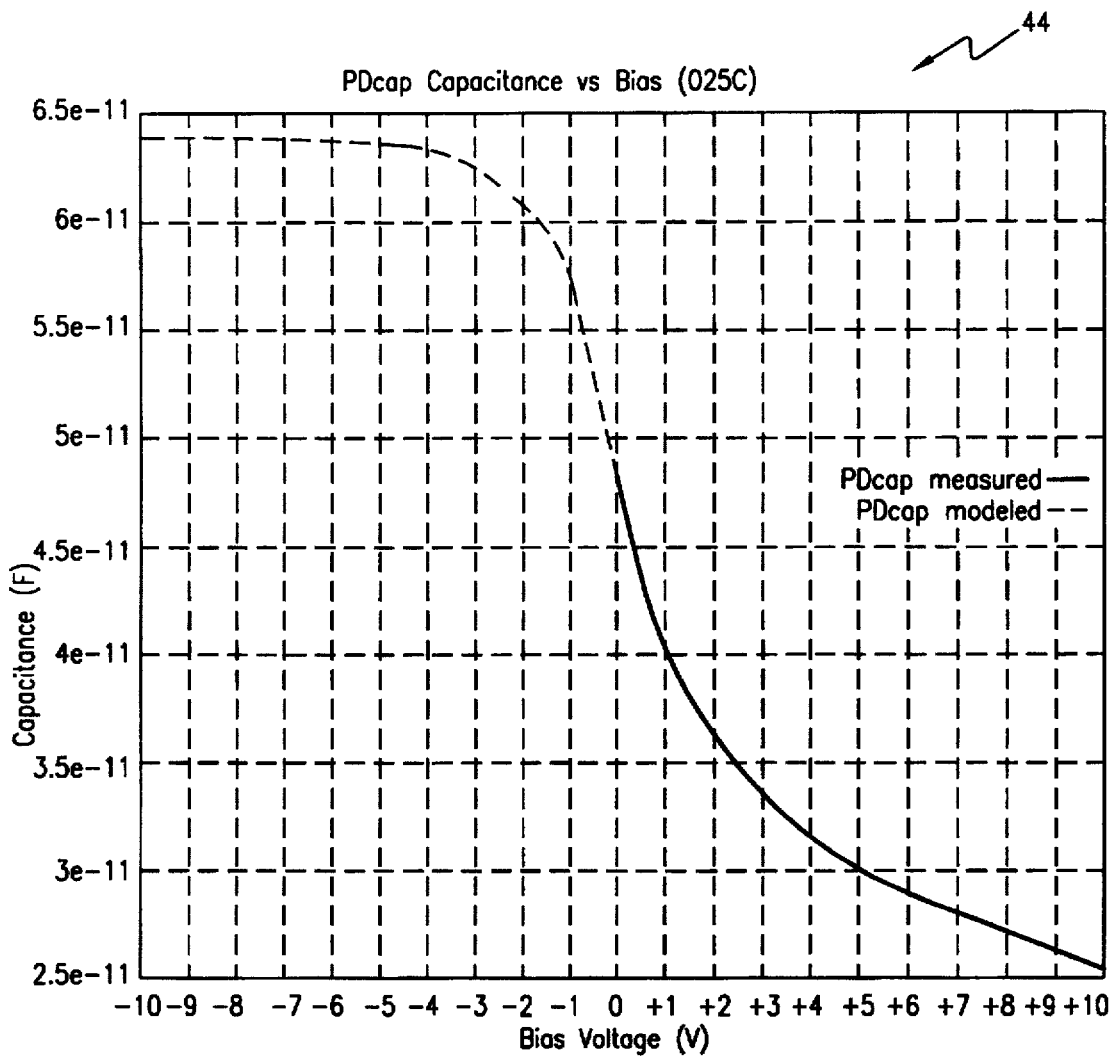

Referring now to FIGS. 13 and 14, FIG. 13 illustrates a graph 44 of the modeled capacitance versus bias voltage for P-depletion capacitor 30 illustrated in FIG. 9a and FIG. 14 is the model equation for graph 44.

The model equation of FIG. 14 provides an excellent fit for P-depletion capacitor 30 for bias voltages greater than 0 V. In order to maintain a accurate representation of the capacitor 30, the capacitance model was derived from measured data and not from conventional P-depletion MOS device equations.

Figure 15:
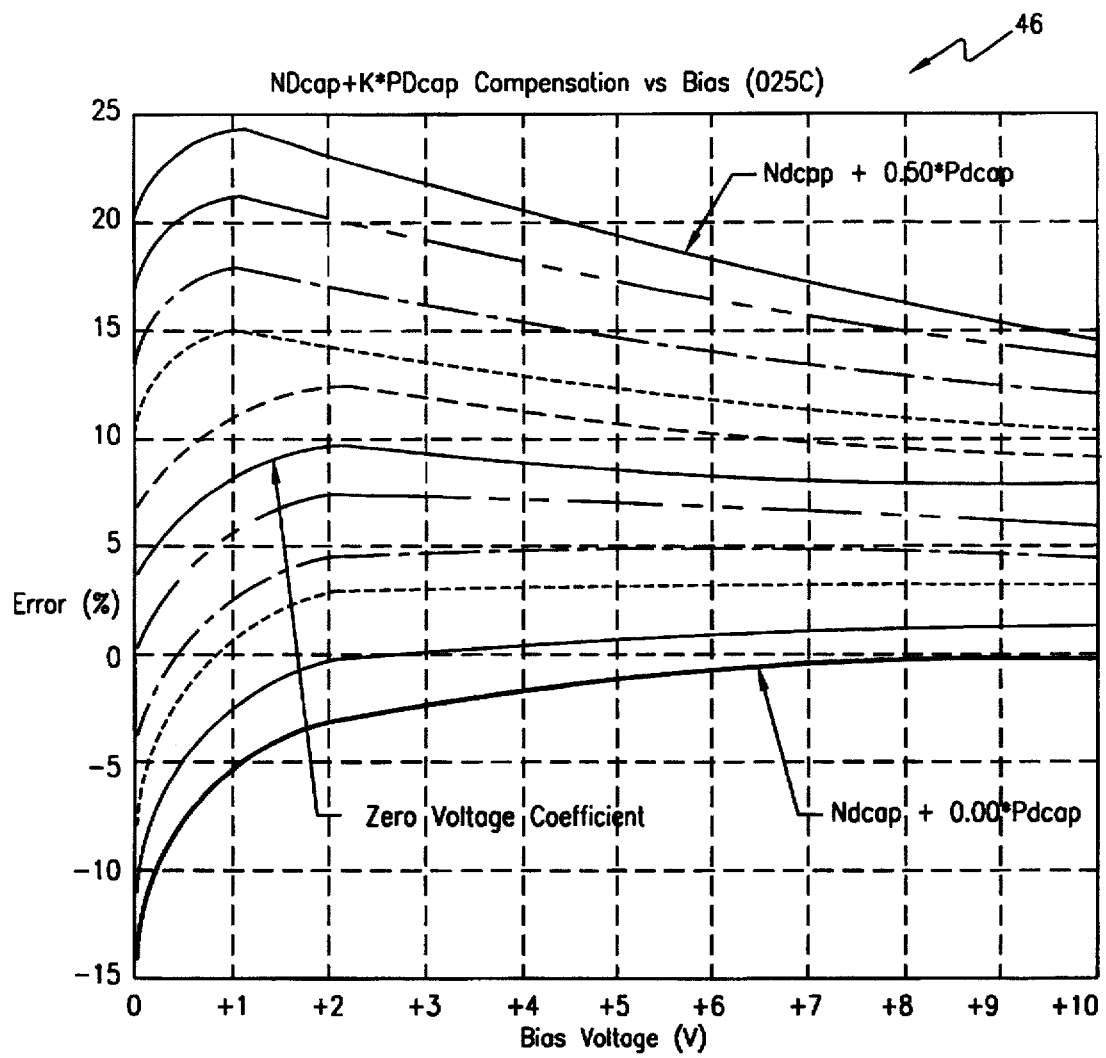
FIG. 15 is a graph illustrating the performance of combining the N-depletion model of FIG. 7 and the P-depletion model of FIG. 13.

Referring now to FIG. 15, graph 46 illustrates the performance of combining the N-depletion model illustrated in graph 28 of FIG. 7 and the P-depletion model illustrated in graph 44 of FIG. 13.

Each curve in graph 46 represents the capacitance obtained by adding a unit size N-depletion capacitor and a corresponding percentage of P-depletion capacitance. If properly performed, the result of this addition can generate a capacitance which has a voltage coefficient of approximately zero at a given bias point and a simultaneously substantially reduced voltage coefficient over a band of applied bias voltage. Graph 46 further shows that in all cases the addition of the P-depletion capacitor has a significant positive performance impact below 3 V bias voltage.

Figure 17:
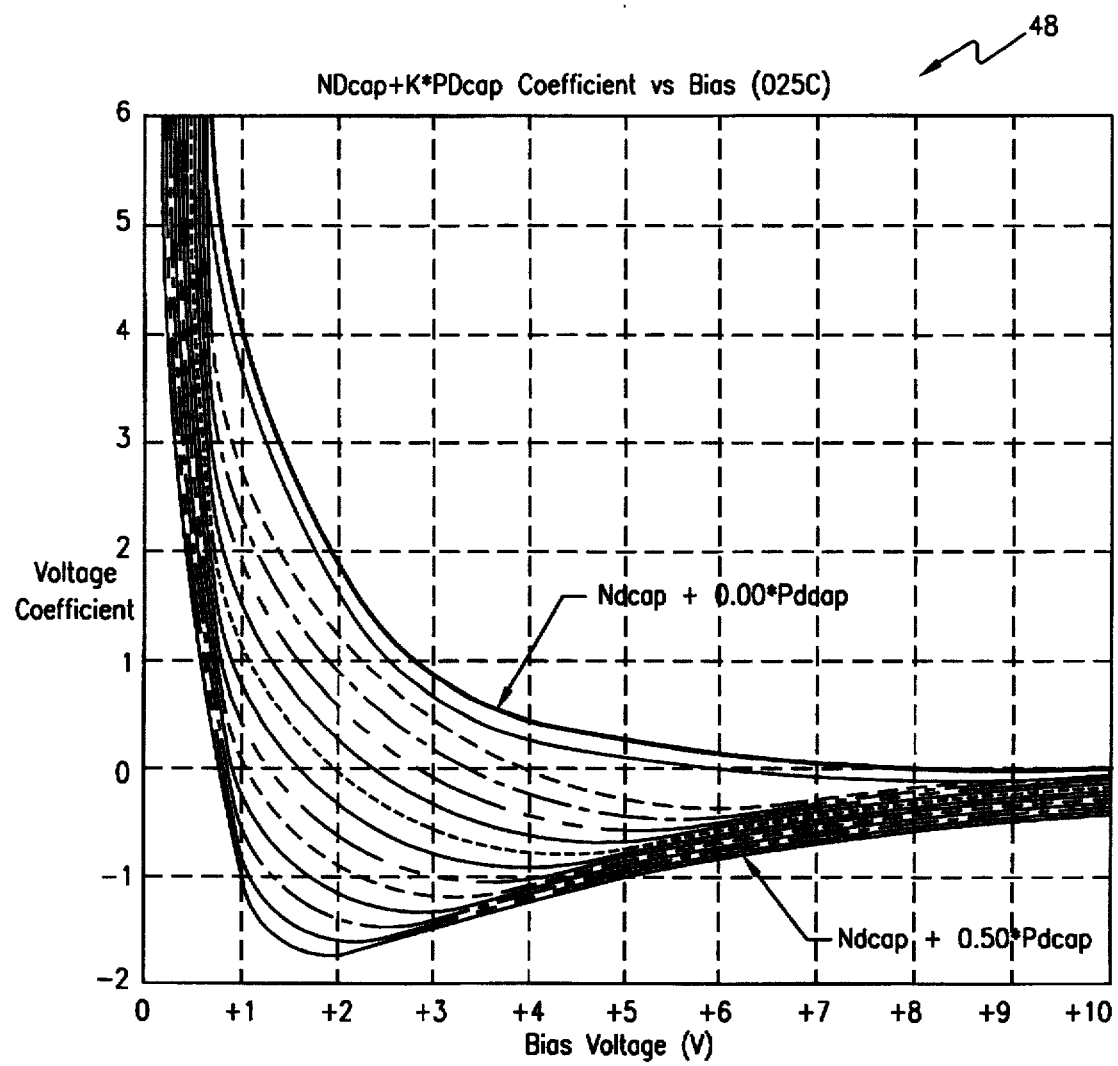
FIG. 17 is a graph illustrating the derivative of the capacitance curves illustrated in FIG. 15.

Referring now to FIG. 17, graph 48 illustrates the voltage coefficient of the N-depletion capacitor alone as compared to the N-depletion plus P-depletion combination, this being the derivative of the capacitance curves of graph 46 of FIG. 15. Graph 48 clearly illustrates that a judicious selection of P-depletion capacitance combined with an N-depletion capacitor can significantly reduce the overall voltage coefficient of the resulting hybrid capacitor system.

Figure 18:
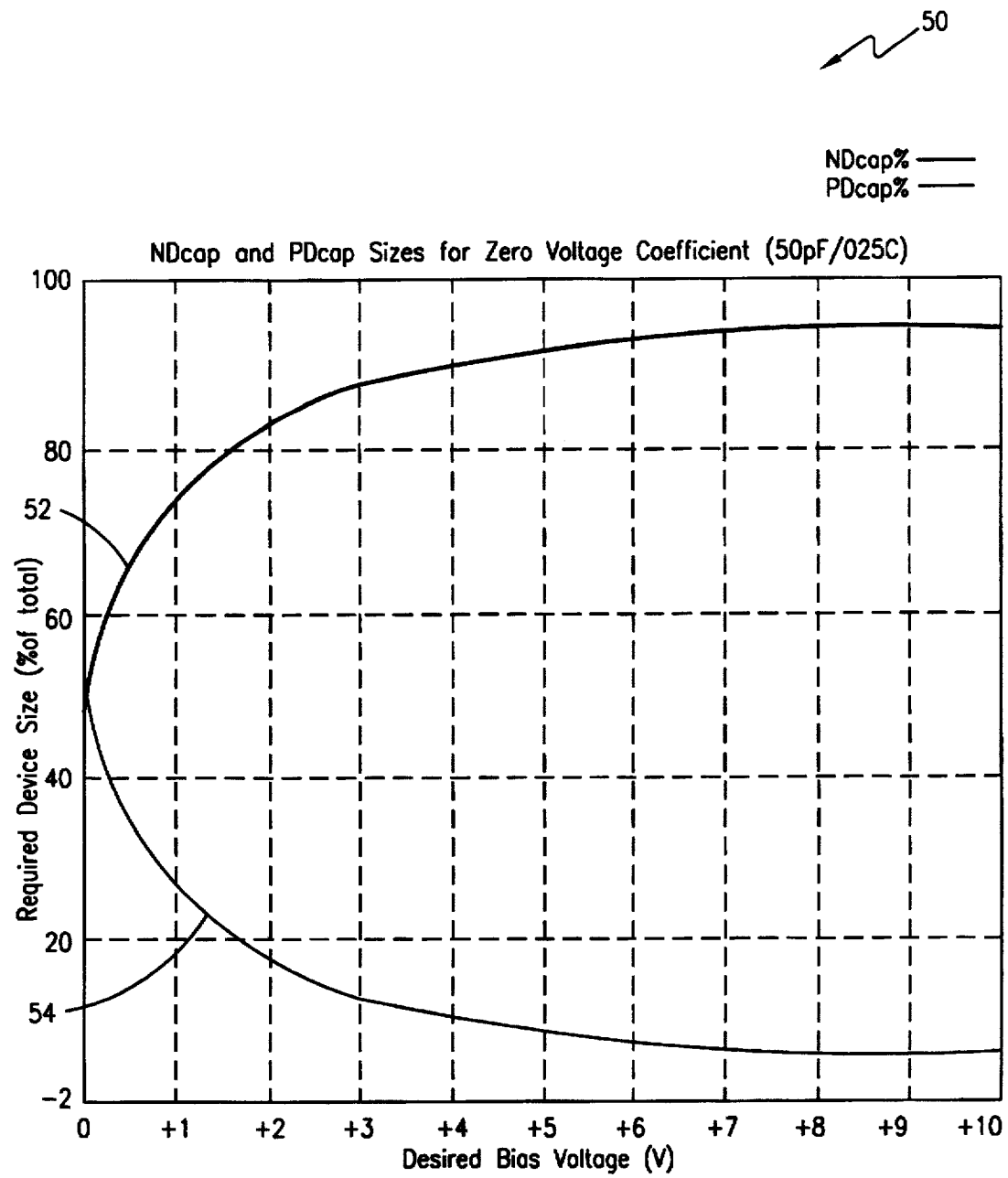
FIG. 18 is a graph illustrating the area percentages of N-depletion and P-depletion capacitors required to generate a 50 pF equivalent capacitance with zero voltage coefficient at a specified bias voltage.

Referring now to FIG. 18, graph 50 illustrates the area percentages of N-depletion and P-depletion capacitors required to generate a 50 pF equivalent capacitance with zero voltage coefficient at a specified bias voltage. The X-axis of graph 50 represents the desired target bias voltage and the two curves 52 and 54 represent the percentage of total gate area consumed by the N-depletion capacitor and the P-depletion capacitor respectively. From graph 50 it can be seen that at bias voltages above 3 V the ratio of N-depletion to P-depletion capacitance is almost constant. This observation is consistent with the fact that at these bias voltages the N-depletion voltage coefficient is minimized.

Figure 16:
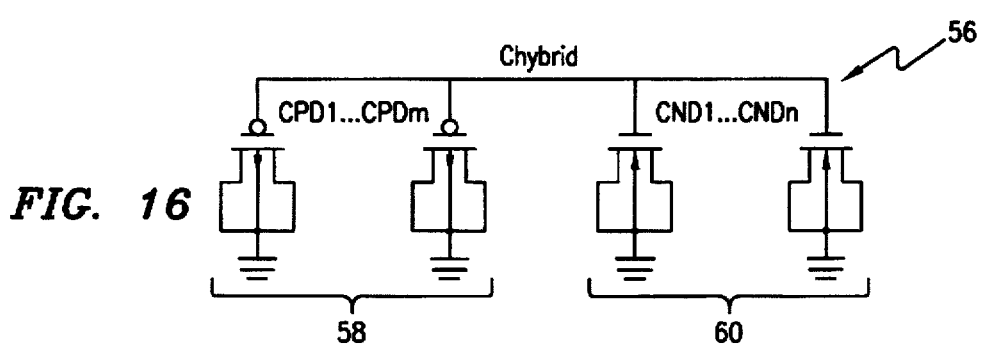
FIG. 16 is a schematic diagram illustrating a preferred embodiment of the present invention.

Referring now to FIG. 16, there is shown a schematic of a hybrid capacitor structure 56 of preferred embodiment of the present invention. Capacitor 56 includes a predetermined number of P-depletion capacitors 58 connected in parallel with a predetermined number of N-depletion capacitors 60. The number of P-depletion and N-depletions capacitors are chosen such that at a predetermined bias point the voltage and temperature coefficients of hybrid capacitor 56 are substantially zero and capacitor 56 becomes to first order ideal in its reactive behavior.

Figure 21:
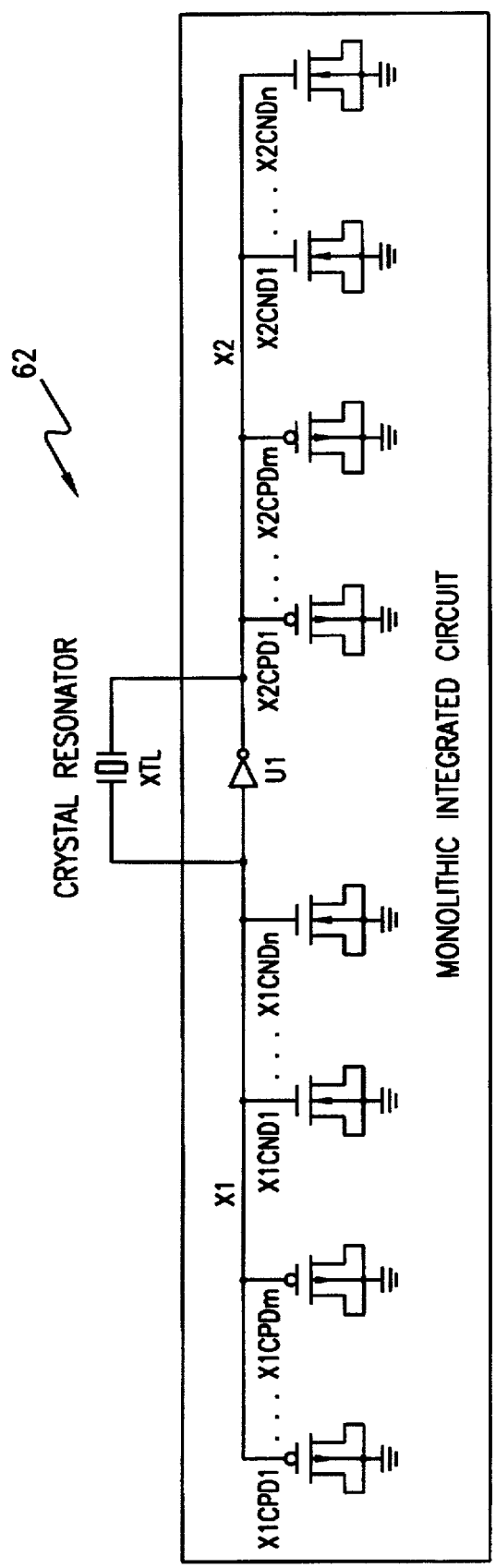
FIG. 21 is a schematic diagram illustrating an alternative preferred embodiment of the present invention.

Referring now to FIG. 21, there is shown another preferred embodiment of the present invention. In this preferred embodiment, the claimed invention is used in the context of a real-time crystal clock oscillator module operating at 32768 Hz utilizing a lithium 3 V battery as the backup power source, and a nominal 5 V power supply when not operating in battery-backup mode.

Shown in FIG. 21 is a monolithic crystal clock oscillator 62 including an inverting amplifier U1 which drives an externally attached crystal resonator XTL. U1 power is obtained from a 3 V lithium battery when the system is not supplied from an external 5 V power source.

The load capacitance required to trim the crystal oscillator to the desired operating frequency is generated by multiple N-depletion and P-depletion capacitors connected at nodes X1 and X2, respectively, and connected such that the polysilicon gates of the load capacitors are joined at these nodes and the source/drain/bulk connections of the load capacitors are connected to the silicon substrate.

The present embodiment of the invention shown in FIG. 21 incorporates all required circuitry with the exception of the CRYSTAL RESONATOR XTL on a single silicon substrate.

N-depletion Capacitor (CND1 . . . CNDn/X1CND1 . . . X1CNDn/X2CND1 . . . X2CNDn)

The preferred embodiments shown in FIGS. 16 and 21 utilize N-depletion MOSFET transistors with species/dose/energy of phosphorus/3.0e-13/180, 855 ohms/square well resistance, and a threshold voltage of approximately −3 V. These process parameters can vary significantly and still embody the spirit of the invention.

The capacitor structure is composed of two plates, one comprising the polysilicon gate of the N-depletion MOSFET and the other comprising the connection of the source/drain/bulk connection of the same MOSFET. In normal operation the source/drain/bulk connection is connected to the substrate of the integrated circuit. This represents a conventional circuit topology for N-depletion capacitors.

The capacitance characteristic of this N-depletion transistor is accurately modeled by the equation illustrated in FIG. 7 for applied gate voltages of −1 V or greater. It is significant to note that the targeted bias point for the invention is in the range of 0 V to 3 V applied gate voltage.

In the embodiments shown in FIGS. 16 and 21, the preferred implementation of the N-depletion capacitors is in terms of unit-sized capacitors. The use of replicated capacitors of some convenient unit size greatly diminishes scaling errors caused by field fringing effects in the overall hybrid capacitor structure. An integer number N of unit sized capacitors is utilized in the presently preferred embodiments, although non-integer values can also be successfully implemented.

P-depletion Capacitor (CPD1 . . . CPDn/X1CPD1 . . . X1CPDn/X2CPD1 . . . X2CPDn)

The preferred embodiments shown in FIGS. 16 and 21 utilize P-depletion MOSFET transistors with species/dose/energy of boron/5.0e-13/60, 1850 ohms/square well resistance, and a threshold voltage of approximately −3 V. These process parameters can vary significantly and still embody the spirit of the invention. The capacitor structure is composed of two plates, one comprising the polysilicon gate of the P-depletion MOSFET and the other comprising the connection of the source/drain/bulk connection of the same MOSFET. In normal operation the source/drain/bulk connection is connected to the substrate of the integrated circuit. This represents an unconventional circuit topology for P-depletion capacitors.

The capacitance characteristic of this P-depletion transistor is accurately modeled by the equation illustrated in FIG. 13 for applied gate voltages of 0 V or greater. It is significant to note that the targeted bias point for the invention is in the range of 0 V to 3 V applied gate voltage.

In the embodiments shown in FIGS. FIG. 16 and 21, the preferred implementation of the P-depletion capacitors is in terms of unit-sized capacitors. The use of replicated capacitors of some convenient unit size greatly diminishes scaling errors caused by field fringing effects in the overall hybrid capacitor structure. An integer number M of unit sized capacitors is utilized in the presently preferred embodiments, although non-integer values can also be successfully implemented.

Inverting Amplifier (U1)

Referring now to the preferred embodiment shown in FIG. 21, an inverting amplifier U1 is used in conjunction with the external crystal resonator XTL to form a crystal oscillator.

The load capacitors are generated via hybrid combinations of P-depletion and N-depletion capacitors connected in parallel. This capacitor configuration provides substantially improved immunity to frequency drift caused by fluctuations in the bias point and gain of the inverting amplifier U1.

Although the capacitive load presented to nodes X1 and X2 is identical, the need for the capacitive load to be different on the X1 and X2 nodes in certain circumstances is contemplated. This has no significant impact on the implementation of the invention, as any voltage-insensitive capacitance value required can by synthesized using appropriate mixtures of P-depletion and N-depletion capacitors.

Calculation of Relative Capacitor Sizes

The major task required when constructing the embodiments shown in FIGS. 16 and 21 is the proper selection of the M and N integer values and the unit capacitor sizes for the N-depletion and P-depletion capacitors.

This operation is accomplished in two steps. The first step is the selection of the area values required for the N-depletion and P-depletion capacitors. For example, using the N-depletion and P-depletion area solution equations presented in FIG. 22, and assuming a desired target capacitance of 50 pF and zero voltage coefficient at 1 V applied bias, the required capacitor areas are 22691.7 square microns for the N-depletion capacitor and 8143.17 square microns for the P-depletion capacitor. The ratio of the N-depletion to P-depletion size is 2.79:1.

To generate the unit capacitor size, the N-depletion and P-depletion capacitor areas are converted to near integers and then factored into primes that are easily squared.

For example, the P-depletion area is very close to an equivalent square capacitor which is 90 microns on each side, or 8100 square microns. The N-depletion capacitor is roughly equivalent to a square capacitor which is 150 microns on each side, or 22500 square microns. The greatest common divisor of each square capacitor is 30 microns.

Thus, the unit sized capacitor should be sized as a square capacitor 30 microns on each side. From this analysis, it can be deduced that N, the number of N-depletion capacitors, is (150*150)/(30*30)=25, whereas M, the number of P-depletion capacitors is (90*90)/(30*30)=9.

It is understood that there many ways to optimize, factor, and implement the N-depletion and P-depletion capacitors to obtain both the desired total capacitance value and the desirable attribute of minimal voltage coefficient.

Referring now to FIGS. 23 and 24, there is shown a preferred embodiment of an N-depletion/P-depletion capacitor structure in which individual N-depletion and P-depletion capacitors are combined in an arbitrary fashion via the use of transmission gate analog switches.

In the embodiment shown in FIGS. 23 and 24, two digital words each comprising an arbitrary number of bits are used to select which of the transmission gate switches are activated, thus providing a method of placing an arbitrary number of N-depletion and P-depletion capacitors in parallel.

Since processing variations are to be expected with the formation of N-depletion and P-depletion capacitors, this technique allows a variable capacitance to be generated based on the contents of the N-depletion and P-depletion control words. In many situations it will be useful for the size of the N-depletion and P-depletion capacitor structures to be organized in terms of powers of two, making the digital N-depletion and P-depletion control words directly reflect the capacitance value generated by each of the N-depletion and P-depletion capacitor arrays.

It is understood to be within the scope of this invention to generate the capacitor values based on a multiple of a standard unit-sized capacitor. Further, the capacitor array may be configured to have something other than binary weighting. For example, a logarithmic weighting for a variety of frequency control application in which the capacitor value generated produces a non-linear change in an oscillator whose frequency is dictated by the load capacitance generated by this structure. This would in certain circumstances permit the linearization of an otherwise non-linear crystal oscillator frequency characteristic.

Also, the weighting of the N-depletion and P-depletion capacitor arrays may differ to allow a finer granularity in the N-depletion or P-depletion capacitance value. This technique allows for a finer precision of N-depletion to P-depletion capacitance weighting to permit a more accurate targeting of both the overall effective capacitance value as well as the zero voltage coefficient point of operation of the hybrid capacitance structure.

AUXILIARY VOLTAGE COEFFICIENT MODULATION

Figure 25:
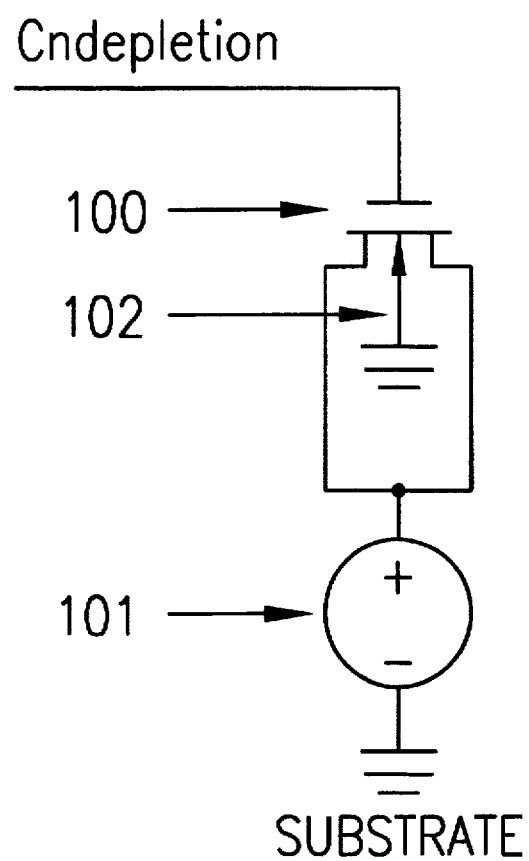
FIG. 25 is a schematic diagram of another preferred embodiment of an integrated circuit capacitor structure of the present invention.
Figure 26:
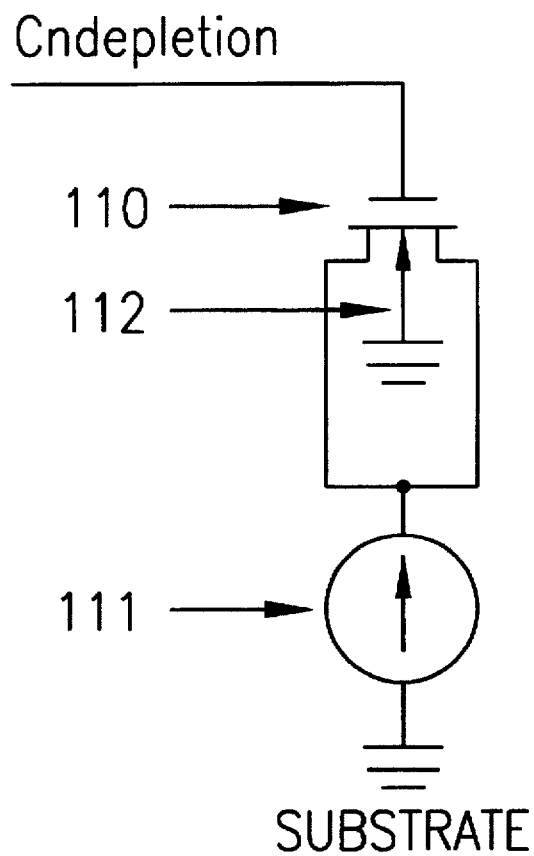
FIG. 26 is a schematic diagram of still another preferred embodiment of an integrated circuit capacitor structure of the present invention.

Under some circumstances it is advantageous to be able to modulate the voltage coefficient of an integrated circuit capacitor rather than completely eliminate its variation. FIGS. 25 and 26 illustrate conventional nwell/psub embodiments which can be used to provide continuous variation in the voltage coefficient of an integrated circuit capacitor structure. It is contemplated to be within the scope of this invention that conventional pwell/nsub embodiments may also be used.

Referring to the circuit diagrams of FIG. 25 and FIG. 26, the basic topology is identical to that of the embodiments illustrated in FIG. 16 with the exception that the N-depletion capacitors 100 and 110 no longer have their source/drain/bulk connections tied directly to the substrate, but rather the source/drain connections are driven by a voltage source 101 (FIG. 25) or current source 111 (FIG. 26) which may be continuously modulated over the range of available circuit voltages and currents.

While only a single N-depletion capacitor structure is illustrated in FIGS. 25 and 26, it is contemplated that these can be used in any combination with the other capacitor embodiments disclosed herein, and other embodiments which reflect the spirit and intent of the invention to provide a variety of fixed and variable capacitance values within the context of an integrated capacitor structure.

Voltage Modulated Capacitance/Voltage Coefficient

Referring specifically to FIG. 25, the voltage source 101 modulates the effective gate-source/drain voltage seen by the N-depletion capacitor structure 100 and as such changes the effective amount of N-depletion capacitance present in the hybrid capacitor structure. By increasing the voltage present at the source-drain interface, the effective N-depletion capacitance decreases and its voltage coefficient increases, thereby increasing the overall voltage coefficient and decreasing the total capacitance of the hybrid capacitor structure.

Since the well connection 102 in this configuration is essentially the substrate, the current flow out of voltage source 101 is determined primarily by the leakage currents associated with the source/drain-to-substrate junction diode present in the N-channel MOS structure 100. The leakage currents associated with reverse-biased integrated circuit diodes are a strong function of both device area as well as temperature and fabrication process. Thus, the embodiment illustrated in FIG. 25 can be used to modulate the voltage coefficient and capacitance value irrespective of ambient temperature.

Current Modulated Capacitance/Voltage Coefficient

Referring specifically to FIG. 26, the current source 111 can be either a constant current source which is insensitive to temperature variations, or a current source which is modulated by some function of temperature or other circuit parameters. This permits the modulation of the capacitance and voltage coefficient of capacitance structure 110 in a controlled method as a function of ambient temperature.

The voltage present at the source-drain interface in this configuration is a direct function of the current source value as well as the leakage resistance presented by the reverse-biased junction diode represented by the source/drain-substrate interface within the N-channel MOS structure 110.

Junction Leakage Characteristics

Figure 27:
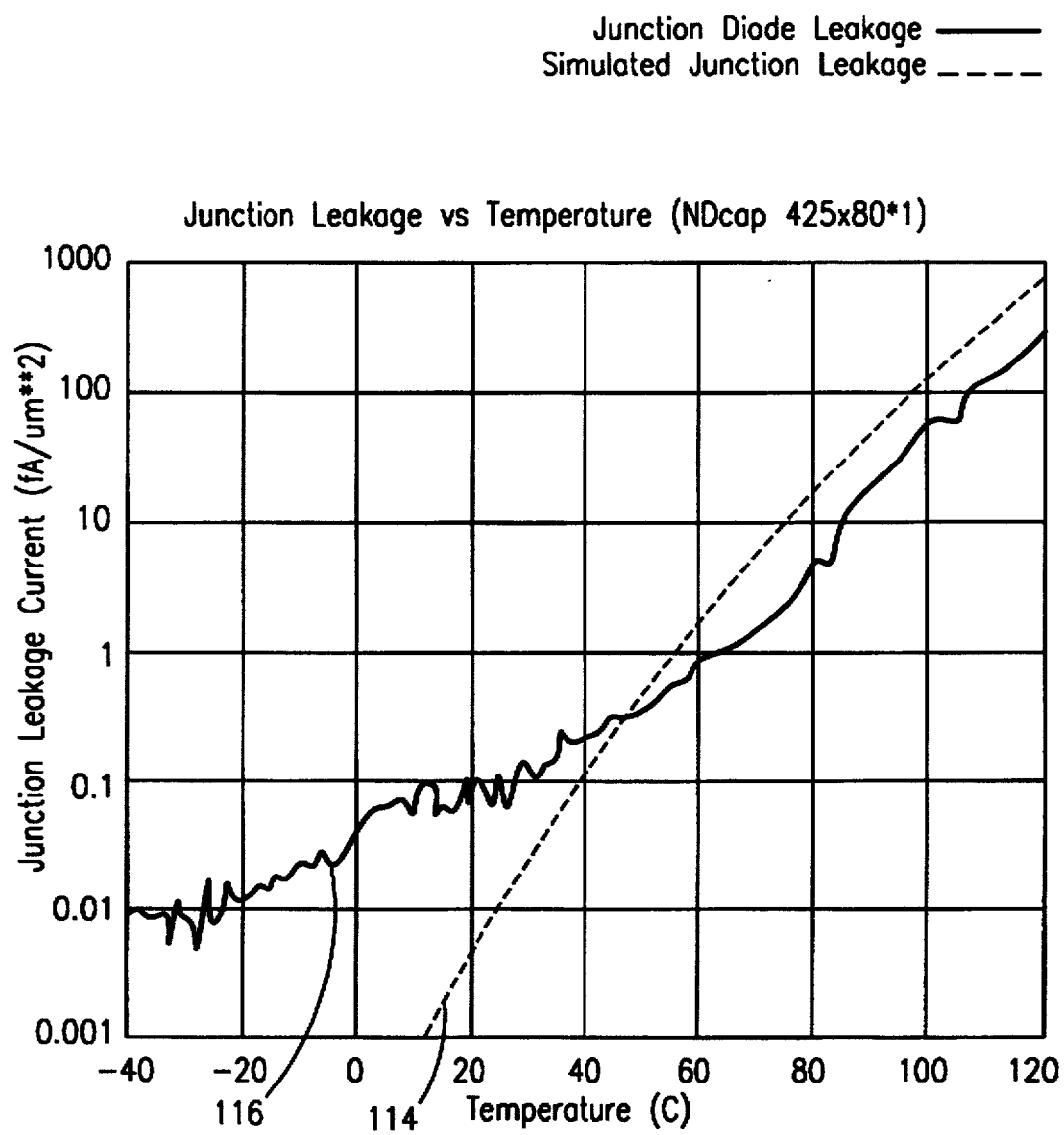
FIG. 27 is a graph illustrating junction leakage characteristics of an integrated capacitor as similarly shown in FIG. 26.

Referring now to FIG. 27, there is illustrated a graph representing the characteristics of the junction leakage current versus temperature of a device as similarly shown in FIG. 26 with line 114 representing the simulated junction leakage and line 116 representing the measured junction diode leakage. It is understood that the junction diode characteristics are a strong function of temperature, process, and device geometry, and that it is possible to achieve a variety of characteristics in this respect.

FIG. 27 shows that the junction leakage current increases generally exponentially with temperature, indicating that a constant current generated from current source 111 (see FIG. 26) would result in a non-linear source-drain potential and thus a non-linear voltage coefficient and N-depletion capacitance value.

Of significant interest in FIG. 27 are the simulated 114 and measured 116 lines. These indicate that the measured device characteristics vary significantly from simulated characteristics, especially below room temperature. In many cases there exists several orders of magnitude difference in measured versus simulated behavior, indicating that conventional circuit simulators can not be relied on to provide the information necessary to make use of the junction leakage in practical circuit applications.

Voltage Mode Crystal Oscillator Temperature Compensation

Figure 28:
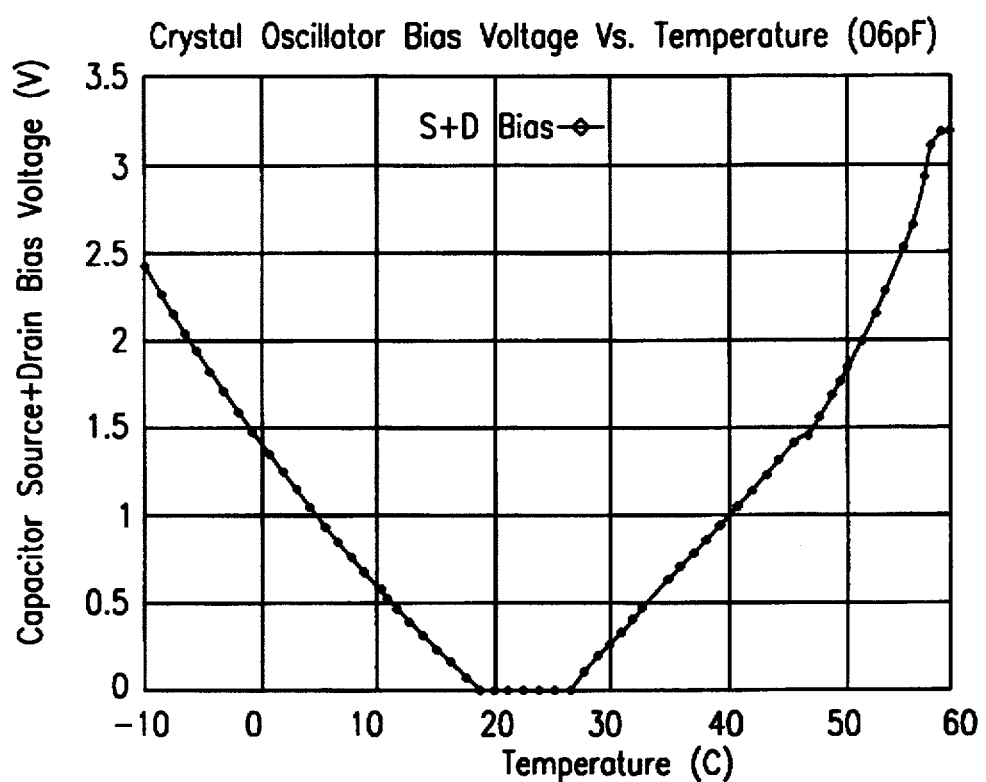
FIG. 28 is a graph illustrating the characteristics of capacitor source-drain bias voltage versus temperature for an integrated capacitor as similarly shown in FIG. 26.

The non-linear characteristics shown in FIG. 27 can be put to effective use in performing temperature compensation of crystal resonators. As an example of this, FIG. 28 illustrates the required compensation voltage required to temperature compensate a quartz crystal with a parabolic temperature coefficient. As can be seen from FIG. 28, the compensation voltage applied to the source/drain is relatively parabolic in nature, corresponding to the changing characteristics of the crystal resonator above and below the parabolic turnover temperature of 25° C.

Current Mode Crystal Oscillator Temperature Compensation

Figure 29:
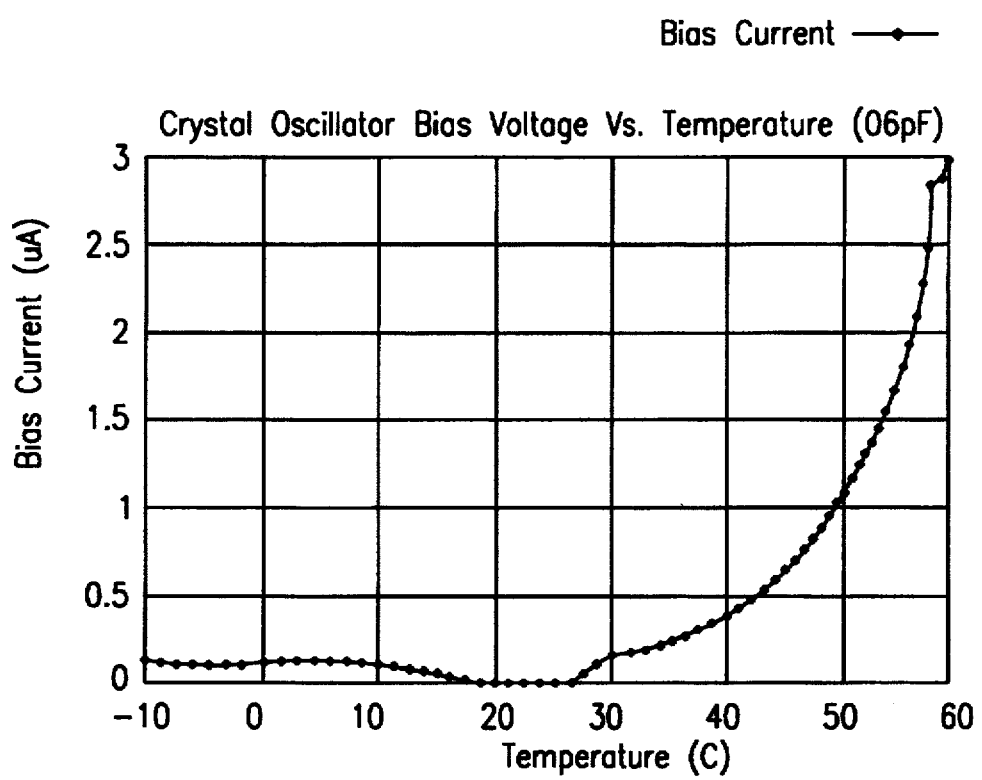
FIG. 29 is graph illustrating bias current versus temperature for an integrated capacitor as similarly shown in FIG. 26.

Since low-power current references are in general easier to implement than low-power voltage references in CMOS process technology, the current-mode compensation scheme of FIG. 26 is in general a preferable solution in battery-powered equipment applications. To this end, FIG. 29 illustrates the current source value required to achieve the same degree of temperature compensation illustrated in FIG. 28. FIG. 29 illustrates that the required current source value below the turnover temperature of 25° C. is essentially constant, and above the turnover temperature the required current characteristic is non-linear. The reason for this change in characteristic over that illustrated in FIG. 28 is the non-linear nature of the junction diode leakage current as illustrated in FIG. 27. The use of the circuit topology in illustrated in FIG. 26 has resulted in the necessity of only one non-linear current source to implement the temperature compensation function, an efficiency improvement over the topology in FIG. 25 for low power applications.

Note also that the maximum current required to implement the temperature compensation function in FIG. 29 is approximately 3 nA. It would be difficult in a practical manner to generate a low power voltage reference with this amount of current to implement the voltage compensation characteristic illustrated in FIG. 28.

CONCLUSION

Although preferred embodiments of the present invention have been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. An integrated monolithic capacitor with reduced voltage/temperature drift, comprising:

at least one n-channel MOSFET capacitor, said at least one n-channel MOSFET capacitor including a drain connection, a gate connection, a source connection, and a bulk connection;

at least one p-channel MOSFET capacitor, said at least one p-channel MOSFET capacitor including a drain connection, a gate connection, a source connection, and a bulk connection;

means for electrically connecting said gate connection of said at least one n-channel MOSFET capacitor with said gate connection of said at least one p-channel MOSFET capacitor;

means for connecting said drain connection, said source connection and said bulk connection of said at least one n-channel MOSFET capacitor; and means for electrically connecting said drain connection, said source connection and said bulk connection of said at least one p-channel MOSFET capacitor;

wherein said at least one n-channel MOSFET capacitor and said at least one p-channel MOSFET capacitor are doped to generate generally offsetting capacitance characteristics in a determined range.

2. The integrated monolithic capacitor as recited in claim 1, wherein:
said at least one n-channel MOSFET capacitor is a depletion MOSFET capacitor.

3. The integrated monolithic capacitor as recited in claim 1, wherein:
said at least one n-channel MOSFET capacitor is an enhancement MOSFET capacitor.

4. The integrated monolithic capacitor as recited in claim 1, wherein:
said at least one p-channel MOSFET capacitor is a depletion MOSFET capacitor.

5. The integrated monolithic capacitor as recited in claim 1, wherein:
said at least one p-channel MOSFET capacitor is an enhancement MOSFET capacitor.

6. The integrated monolithic capacitor as recited in claim 1, wherein:
said at least one n-channel MOSFET capacitor and said at least one p-channel MOSFET capacitor are each generated on a p-type substrate.

7. The integrated monolithic capacitor as recited in claim 1, wherein:
said at least one n-channel MOSFET capacitor and said at least one p-channel MOSFET capacitor are each generated on an n-type substrate.

8. The integrated monolithic capacitor as recited in claim 1, wherein:
said at least one n-channel MOSFET capacitor and said at least one p-channel MOSFET capacitor are connected in parallel.

9. An integrated capacitor, comprising:

a first group of MOSFET capacitors including a plurality of n-channel MOSFET capacitors connected in parallel;

a second group of MOSFET capacitors including a plurality of p-channel MOSFET capacitors connected in parallel; and said first group of MOSFET capacitors being electrically connected to said second group of MOSFET capacitors;

wherein said plurality of n-channel MOSFET capacitors and said plurality of p-channel MOSFET capacitors are each doped such that the capacitance characteristics of said plurality of n-channel MOSFET capacitors and the capacitance)characteristics of said plurality of p-channel MOSFET capacitors generally offset in a determined range.

10. The integrated capacitor as recited in claim 9, wherein:
at least one of said plurality of n-channel MOSFET capacitors is a depletion MOSFET capacitor.

11. The integrated capacitor as recited in claim 9, wherein:
at least one of said plurality of n-channel MOSFET capacitors is an enhancement MOSFET capacitor.

12. The integrated capacitor as recited in claim 9, wherein:
at least one of said plurality of p-channel MOSFET capacitors is a depletion MOSFET capacitor.

13. The integrated capacitor as recited in claim 9, wherein:
at least on of said plurality of p-channel MOSFET capacitors is an enhancement MOSFET capacitor.

14. The integrated capacitor as recited in claim 9, wherein:
said plurality of n-channel MOSFET capacitors and said plurality of p-channel MOSFET capacitors are each generated on a p-type substrate.

15. The integrated capacitor as recited in claim 9, wherein:
said plurality of n-channel MOSFET capacitors and said plurality of p-channel MOSFET capacitors are each generated on a n-type substrate.

16. The integrated capacitor as recited in claim 9, wherein:
said first group of MOSFET capacitors and said second group of MOSFET capacitors are connected in parallel.

17. An integrated capacitor with controlled voltage/temperature drift, comprising:

a plurality of n-channel MOSFET capacitors connected in parallel;

a plurality of p-channel MOSFET capacitors connected in parallel;

means for electrically connecting said plurality of n-channel MOSFET capacitors and said plurality of p-channel MOSFET capacitors; and means for variably selecting at least one of said plurality of n-channel MOSFET capacitors and at least one of said plurality of p-channel MOSFET capacitors;

wherein said plurality of n-channel MOSFET capacitors and said plurality of p-channel MOSFET capacitors are doped such that a combination of said n-channel MOSFET capacitors and a combination of said p-channel MOSFET capacitors can be selected to generate offsetting capacitance characteristics in a determined range.

18. The integrated capacitor as recited in claim 17, wherein:

at least one of said plurality of n-channel MOSFET capacitors includes a drain connection, a gate connection, a source connection, and a bulk connection; and at least one of said plurality of p-channel MOSFET capacitors includes a drain connection, a gate connection, a source connection, and a bulk connection.

19. The integrated capacitor as recited in claim 18, further comprising:

means for electrically connecting together said drain connection, said source connection and said bulk connection of said at least one of said plurality of n-channel MOSFET capacitors; and means for electrically connecting together said drain connection, said source connection and said bulk connection of said at least one of said plurality of p-channel MOSFET capacitors.

20. The integrated monolithic capacitor as recited in claim 19, wherein:

said source connection and said drain connection of said at least one n-channel MOSFET capacitor are connected to a voltage source; and said bulk connection of said at least one n-channel MOSFET capacitor is connected to a substrate.

21. The integrated monolithic capacitor as recited in claim 19, wherein:

said source connection and said drain connection of said at least one n-channel MOSFET capacitor are connected to a current source; and said bulk connection of said at least one n-channel MOSFET capacitor is connected to a substrate.

22. The integrated monolithic capacitor as recited in claim 19, wherein:

said source connection and said drain connection of said at least one p-channel MOSFET capacitor are connected to a voltage source; and said bulk connection of said at least one p-channel MOSFET capacitor is connected to a positive power supply.

23. The integrated monolithic capacitor as recited in claim 19, wherein:

said source connection and said drain connection of said at least one p-channel MOSFET capacitor are connected to a current source; and said bulk connection of said at least one p-channel MOSFET capacitor is connected to a positive power supply.

24. An integrated monolithic capacitor with modulated voltage/temperature drift, comprising:

at least one n-channel MOSFET capacitor, said at least one n-channel MOSFET capacitor including a drain connection, a gate connection, a source connection, and a bulk connection;

at least one p-channel MOSFET capacitor, said at least one p-channel MOSFET capacitor including a drain connection, a gate connection, a source connection, and a bulk connection;

means for electrically connecting said gate connection of said at least one n-channel MOSFET capacitor with said gate connection of said at least one p-channel MOSFET capacitor;

means for electrically connecting together said drain connection, said source connection and said bulk connection of said at least one n-channel MOSFET capacitor; and means for electrically connecting together said drain connection, said source connection and said bulk connection of said at least one p-channel MOSFET capacitor;

wherein said at least one n-channel MOSFET capacitor and said at least one p-channel MOSFET capacitor are doped to generate generally predetermined capacitance characteristics in a determined range.

25. The integrated monolithic capacitor as recited in claim 24, wherein:

said source connection and said drain connection of said at least one n-channel MOSFET capacitor are connected to a voltage source; and said bulk connection of said at least one n-channel MOSFET capacitor is connected to a substrate.

26. The integrated monolithic capacitor as recited in claim 24, wherein said source connection and said drain connection of said at least one n-channel MOSFET capacitor are connected to a current source; and said bulk connection of said at least one n-channel MOSFET capacitor is connected to a substrate.

27. The integrated monolithic capacitor as recited in claim 24, wherein said source connection and said drain connection of said at least one p-channel MOSFET capacitor are connected to a voltage source; and said bulk connection of said at least one p-channel MOSFET capacitor is connected to a positive power supply.

28. The integrated monolithic capacitor as recited in claim 24, wherein:

said source connection and said drain connection of said at least one p-channel MOSFET capacitor are connected to a current source; and said bulk connection of said at least one p-channel MOSFET capacitor is connected to a positive power supply.

* * * * *

UNITED STATES PATENT AND TRADEMARK OFFICE
CERTIFICATE OF CORRECTION

PATENT NO : 5,801,411
DATED : September 1, 1998
INVENTOR(S) : Kevin Mark Klughart It is certified that error appears in the above-identified patent and that said Letters Patent are hereby corrected as shown below:

Column 4, line 52  Replace "required"
With --required.--

Column 6, lines 49-50  Replace "implant) Therefore,"
With --implant). Therefore,--

Column 7, lines 26-27  Replace "substrate Excellent"
With --substrate. Excellent--

Column 14, line 31  Replace "capacitance)characteristics"
With --capacitance characteristics--

Signed and Sealed this

Third Day of April, 2001

Attest:

NICHOLAS P. GODICI

Attesting Officer  Acting Director of the United States Patent and Trademark Office